US012002507B2

(12) United States Patent
Yang et al.

(10) Patent No.: US 12,002,507 B2
(45) Date of Patent: *Jun. 4, 2024

(54) STATIC RANDOM ACCESS MEMORY WITH ADAPTIVE PRECHARGE SIGNAL GENERATED IN RESPONSE TO TRACKING OPERATION

(71) Applicants: TAIWAN SEMICONDUCTOR MANUFACTURING CO., LTD., Hsinchu (TW); TSMC Nanjing Company Limited, Nanjing (CN); TSMC China Company Limited, Shanghai (CN)

(72) Inventors: Xiu-Li Yang, Shanghai (CN); He-Zhou Wan, Shanghai (CN); Lu-Ping Kong, Nanjing (CN); Wei-Yang Jiang, Jiangshan (CN)

(73) Assignees: TAIWAN SEMICONDUCTOR MANUFACTURING CO., LTD., Hsinchu (TW); TSMC NANJING COMPANY LIMITED, Nanjing (CN); TSMC CHINA COMPANY LIMITED, Shanghai (CN)

( * ) Notice: Subject to any disclaimer, the term of this patent is extended or adjusted under 35 U.S.C. 154(b) by 0 days.

This patent is subject to a terminal disclaimer.

(21) Appl. No.: 18/068,881

(22) Filed: Dec. 20, 2022

(65) Prior Publication Data

US 2023/0122135 A1 Apr. 20, 2023

Related U.S. Application Data

(63) Continuation of application No. 17/107,165, filed on Nov. 30, 2020, now Pat. No. 11,557,336.

(30) Foreign Application Priority Data

Nov. 3, 2020 (CN) .......................... 202011208387.1

(51) Int. Cl.
*G11C 11/419* (2006.01)
(52) U.S. Cl.
CPC ............................... *G11C 11/419* (2013.01)
(58) Field of Classification Search
CPC .................................................. G11C 11/419
(Continued)

(56) References Cited

U.S. PATENT DOCUMENTS 5,724,294 A 3/1998 Khieu
8,315,085 B1 * 11/2012 Chang .............. G11C 29/50012
365/194

(Continued)

FOREIGN PATENT DOCUMENTS

TW 200919716 A 5/2009
TW 201044278 A1 12/2010
(Continued)

*Primary Examiner* — Sung Il Cho
(74) *Attorney, Agent, or Firm* — Birch, Stewart, Kolasch & Birch, LLP

(57) ABSTRACT

A device is provided. The device includes multiple transistors, a first sense circuit, and a precharge circuit. The transistors are coupled to a tracking bit line and configured to generate a first tracking signal. The first sense circuit is configured to generate a first sense tracking signal in response to the first tracking signal. The precharge circuit is configured to generate, in response to a rising edge and a falling edge of the first sense tracking signal, a precharge signal for precharging data lines.

20 Claims, 10 Drawing Sheets

(58) Field of Classification Search
USPC .......................................................... 365/154
See application file for complete search history.

(56) References Cited

U.S. PATENT DOCUMENTS

| | | | |
|---|---|---|---|
| 9,105,328 B2* | 8/2015 | Chiu | .................... G11C 11/419 |
| 2011/0300413 A1 | 12/2011 | Jacobs et al. | |
| 2013/0255753 A1 | 10/2013 | Escher et al. | |
| 2014/0036602 A1 | 2/2014 | Sharma et al. | |
| 2014/0092674 A1 | 4/2014 | Chung | |
| 2014/0185366 A1* | 7/2014 | Chandwani | ............. G11C 7/08 |
| | | | 365/154 |
| 2014/0204660 A1* | 7/2014 | Chandwani | ........... G11C 11/419 |
| | | | 365/156 |
| 2016/0027529 A1 | 1/2016 | Hoefler et al. | |
| 2016/0282477 A1 | 9/2016 | Mruthyunjaya | |
| 2017/0069390 A1 | 3/2017 | Nam et al. | |
| 2017/0221552 A1 | 8/2017 | Liaw | |
| 2017/0278555 A1 | 9/2017 | Su et al. | |
| 2018/0005678 A1 | 1/2018 | Foong et al. | |
| 2018/0012652 A1 | 1/2018 | Yang et al. | |
| 2018/0047431 A1* | 2/2018 | Lin | ......................... G11C 7/12 |

FOREIGN PATENT DOCUMENTS

| | | |
|---|---|---|
| TW | 201209827 A1 | 3/2012 |
| TW | 201440174 A | 10/2014 |

* cited by examiner

STATIC RANDOM ACCESS MEMORY WITH ADAPTIVE PRECHARGE SIGNAL GENERATED IN RESPONSE TO TRACKING OPERATION

CROSS-REFERENCE TO RELATED APPLICATION

This application is a continuation of U.S. application Ser. No. 17/107,165, filed on Nov. 30, 2020, which claims priority to China Application Serial Number 202011208387.1, filed Nov. 3, 2020, which is herein incorporated by reference.

BACKGROUND

Memory devices have been used in various applications. Generally, the memory devices include, for example, static random access memory (SRAM), and dynamic random access memory (DRAM). A SRAM device is commonly used in high speed communication, image processing and system-on-chip (SOC) applications. In some approaches, the SRAM device includes a sense amplifier. The sense amplifier typically dominates SRAM speed, which is also associated with a circuit of the SRAM device generating a precharge signal for activating SRAM cells.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
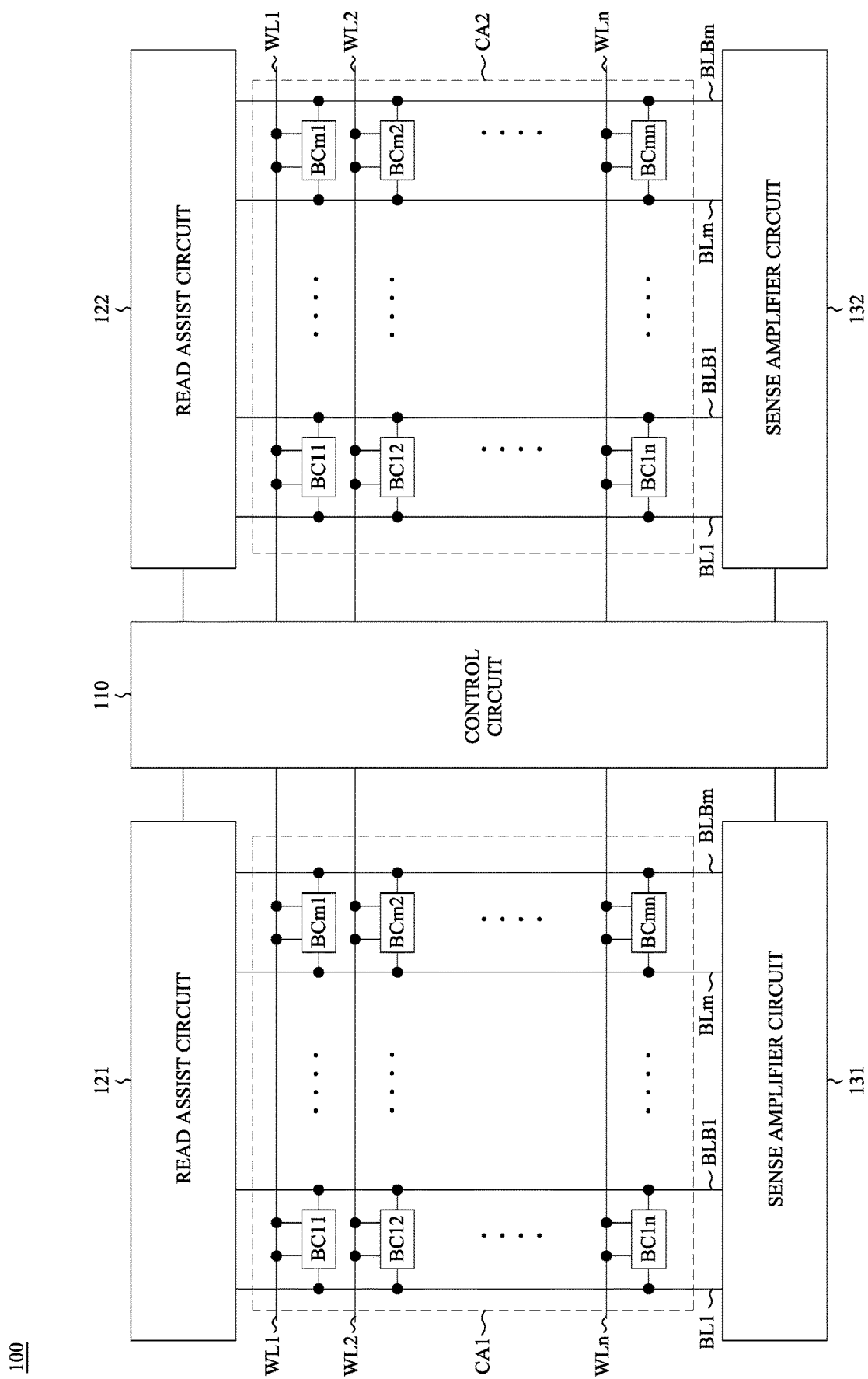
FIG. 1 is a schematic diagram illustrating a memory device, in accordance with some embodiments of the present disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

The terms used in this specification generally have their ordinary meanings in the art and in the specific context where each term is used. The use of examples in this specification, including examples of any terms discussed herein, is illustrative only, and in no way limits the scope and meaning of the disclosure or of any exemplified term. Likewise, the present disclosure is not limited to various embodiments given in this specification.

It will be understood that, although the terms "first," "second," etc., may be used herein to describe various elements, these elements should not be limited by these terms. These terms are used to distinguish one element from another. For example, a first element could be termed a second element, and, similarly, a second element could be termed a first element, without departing from the scope of the embodiments. As used herein, the term "and/or" includes any and all combinations of one or more of the associated listed items.

As used herein, the terms "comprising," "including," "having," "containing," "involving," and the like are to be understood to be open-ended, i.e., to mean including but not limited to.

Reference throughout the specification to "one embodiment," "an embodiment," or "some embodiments" means that a particular feature, structure, implementation, or characteristic described in connection with the embodiment(s) is included in at least one embodiment of the present disclosure. Thus, uses of the phrases "in one embodiment" or "in an embodiment" or "in some embodiments" in various places throughout the specification are not necessarily all referring to the same embodiment. Furthermore, the particular features, structures, implementation, or characteristics may be combined in any suitable manner in one or more embodiments.

In this document, the term "coupled" may also be termed as "electrically coupled", and the term "connected" may be termed as "electrically connected". "Coupled" and "connected" may also be used to indicate that two or more elements cooperate or interact with each other.

Furthermore, spatially relative terms, such as "underlying," "below," "lower," "overlying," "upper" and the like, may be used throughout the description for ease of understanding to describe one element or feature's relationship to another element(s) or feature(s) as illustrated in the figures. The spatially relative terms are intended to encompass different orientations of the device in use or operation in addition to the orientation depicted in the figures. The structure may be otherwise oriented (e.g., rotated 90 degrees or at other orientations) and the spatially relative descriptors used herein may likewise be interpreted accordingly.

As used herein, "around", "about", "approximately" or "substantially" shall generally refer to any approximate value of a given value or range, in which it is varied depending on various arts in which it pertains, and the scope of which should be accorded with the broadest interpretation understood by the person skilled in the art to which it pertains, so as to encompass all such modifications and similar structures. In some embodiments, it shall generally mean within 20 percent, preferably within 10 percent, and more preferably within 5 percent of a given value or range. Numerical quantities given herein are approximate, meaning that the term "around", "about", "approximately" or "substantially" can be inferred if not expressly stated, or meaning other approximate values.

FIG. 1 is a schematic diagram illustrating a memory device 100, in accordance with some embodiments of the present disclosure. In some embodiments, the memory device 100 is implemented by static random access memory (SRAM). For illustration in FIG. 1, the memory device 100 includes a control circuit 110, read assist circuits 121 and 122, sense amplifier circuits 131 and 132 and memory arrays CA1 and CA2. The control circuit 110 is coupled to the read assist circuits 121 and 122, and the sense amplifier circuits 131 and 132. The memory array CA1 is coupled between the assist circuit 121 and the sense amplifier circuit 131, and the memory array CA2 is coupled between the assist circuit 122 and the sense amplifier circuit 132.

The memory device 100 is utilized to read or write digital data from bit cells BC11~BCmn in the memory array CA1 and bit cells BC11~BCmn in the memory array CA2. These digital data can be stored in the bit cells BC11~BCmn, and can be read or access by the memory device 100 from the bit cells BC11~BCmn in the memory array CA1 or CA2.

In some embodiments, the memory array CA1 or CA2 can include M*N bit cells BC11~BCmn arranged along M columns and N rows. The bit cells on the same column are connected to the same bit line and the same complement bit line. For example, the bit cells BC11, BC12 . . . , and BC1n on the same column are connected to the bit line BL1 and also the complement bit line BLB1; the bit cells BCm1, BCm2 . . . , and BCmn on the same column are connected to the bit line BLm and the complement bit line BLBm. The bit cells on the same row are connected to the same word line. For example, the bit cells BC11 and BCm1 on the same row are connected to the word line WL1; the bit cells BC12 and BCm2 on the same row are connected to the word line WL2; and the bit cells BC1n and BCmn on the same row are connected to the word line WLn. For simplicity, each of the bit cells BC11, BC12 . . . , and BC1n, BCm1, BCm2 . . . , and BCmn is referenced as BC hereinafter for illustration, because the bit cells BC11, BC12 . . . , and BC1n, BCm1, BCm2 . . . , and BCmn operate in a similar way in some embodiments. Similarly, each of the bit line BL1 and BLm is referenced as BL, each of the complement bit line BLB1 and BLBm is referenced as BLB hereinafter, and each of the word line WL1, WL2, and WLn is referenced as WL hereinafter, for illustration.

The read assist circuit 121 or 122 is configured to select at least one bit line BL and at least one complement bit line BLB, and configured to adjust voltage levels on the corresponding bit line BL and the complement bit line BLB in a read operation. In some embodiments, in the read operation, the read assist circuit 121 or 122 precharges both of the selected bit line BL and complement bit line BLB to logic high, in response to a precharge signal, thereby voltages of the selected bit line BL and complement bit line BLB being floating. Subsequently, the selected bit line BL and complement bit line BLB start to discharge. The voltages of the selected bit line BL and complement bit line BLB are rapidly dropping, and have a voltage difference large enough to be distinguished when the sense amplifier circuit 131 or 132 is activated.

The sense amplifier circuit 131 or 132 is configured to sense voltage difference s between the selected bit line BLm and complement bit line BLBm in the read operation. In some embodiments discussed with the read assist circuit 121 or 122 above, the sense amplifier circuit 131 or 132 is activated to distinguish the voltage difference, in response to a sense enable signal. As such, the activated sense enable signal is later than the activated precharge signal, and the sense enable signal has a delay compared to the precharge signal. Accordingly, the voltage difference between the selected bit line BL and complement bit line BLB is detected by the sense amplifier circuit 131 or 132, and the data stored in the corresponding bit cells BC can be read.

The configuration of the memory device 100 as illustrated above is also given for illustrative purposes. Various configurations of the memory device 100 are within the contemplated scope of the present disclosure. For example, in various embodiments, the memory device 100 further includes a word line driver configured to select a word line in the read operation. The word line driver is coupled between the memory arrays CA1 and CA2, and is also coupled to the control circuit 110.

Figure 2:
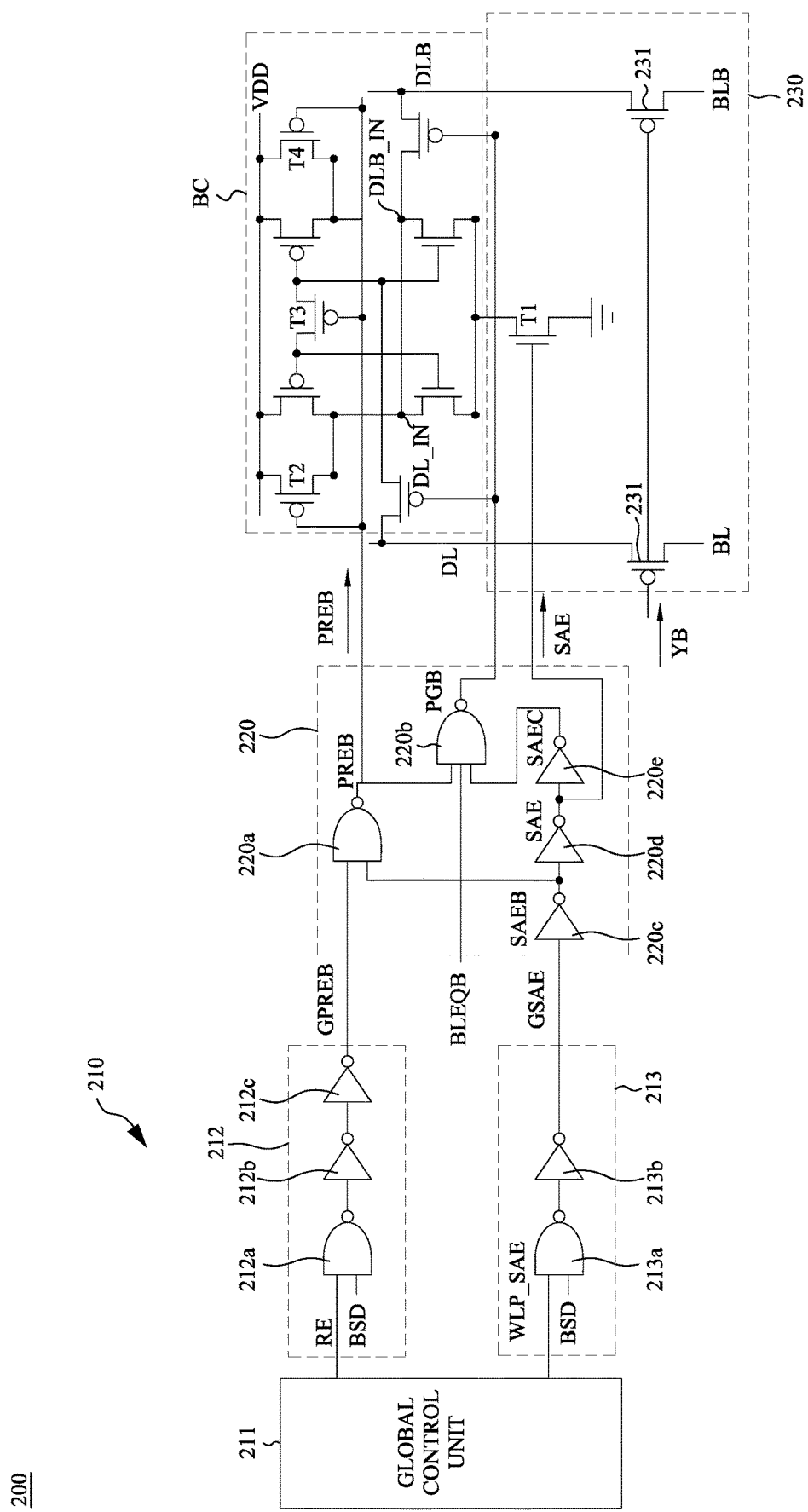
FIG. 2 is an exemplary diagram illustrating structures of a memory device corresponding to the memory device shown in FIG. 1, in accordance with some embodiments of the present disclosure.

Reference now made to FIG. 2. FIG. 2 is an exemplary diagram illustrating structures of a memory device 200 corresponding to the memory device 100 shown in FIG. 1, in accordance with some embodiments of the present disclosure. As illustrated in FIG. 2, the memory device 200 includes a control circuit 210, a read assist circuit 220, a sense amplifier circuit 230, and a bit cell BC. The control circuit 210 includes a global control unit 211, a precharge local control unit 212, and a sense enable local control unit 213. The global control unit 211 is coupled to the precharge local control unit 212 and the sense enable local control unit 213. The precharge local control unit 212 is coupled between the global control unit 211 and the read assist circuit 220. The sense enable local control unit 213 is also coupled between the global control unit 211 and the read assist circuit 220. The read assist circuit 220 is further coupled to the bit cell BC and the sense amplifier circuit 230. The bit cell BC and the sense amplifier circuit 230 are coupled together. Compared to embodiments shown in FIG. 1, in some embodiments, the control circuit 210 corresponds to the control circuit 110; the read assist circuit 220 corresponds to the read assist circuit 121 or 122; the sense amplifier circuit 230 corresponds to the sense amplifier circuit 131 or 132; and the bit cell BC corresponds to one of the bit cells BC in the memory array CA1 or CA2. With respect to the embodiments of FIG. 1, like elements in FIG. 2 are designated with the same reference numbers for ease of understanding.

As illustrated in FIG. 2, the precharge local control unit 212 includes a NAND logic operator 212a and NOT logic operators 212b and 212c. The NAND logic operator 212a, and the NOT logic operators 212b and 212c are coupled in series. One of inputs of the NAND logic operator 212a is coupled to an output of the global control unit 211, for receiving a global precharge signal RE, for the generation of a precharge signal PREB. The other one of inputs of the NAND logic operator 212a is configured to receive a bank select signal BSD, for selecting a corresponding memory bank (not shown) of the memory device 200 to be accessed. An output of the NAND logic operator 212a is coupled to an input of the NOT logic operator 212b. An output of the NOT logic operator 212b is coupled to an input of the NOT logic operator 212c. An output of the NOT logic operator 212c is coupled to an input of the read assist circuit 220, for outputting a local precharing signal GPREB.

The sense enable local control unit 213 includes a NAND logic operator 213a and a NOT logic operator 213b. The NAND logic operator 213a and the NOT logic operator 213b are coupled in series. One of inputs of the NAND logic operator 213a is coupled to another output of the global control unit 211, for receiving a global sense enable signal WLP_SAE, for the generation of a sense enable signal SAE. An output of the NAND logic operator 213a is coupled to an input of the NOT logic operator 213b. An output of the NOT logic operator 213b is coupled to another input of the read assist circuit 220, for outputting a local sense enable signal GSAE.

In some embodiments, the global precharge signal RE and the global sense enable signal WLP_SAE are referred to as global control signals. The global control signals are utilized in the read operation, for controlling memory banks of the memory device 200 to be accessed. The memory bank may include at least one of the memory arrays such as the memory array CA1 or CA2 shown in FIG. 1. In some other embodiments, the local precharge signal GPREB and the local sense enable signal GSAE are referred to as local control signals. The local control signals are also utilized in the read operation, for controlling bit cells in the corresponding memory bank of the memory device 200 to be accessed. The local control signals are similar or identical to the global control signals, when the corresponding memory bank is selected, in response to the bank select signal BSD.

As mentioned above, the precharge local control unit 212 and the sense enable local control unit 213 are utilized to generate the local precharge signal GPREB and the local sense enable signal GSAE, in response to the global precharge signal RE and the global sense enable signal WLP_SAE, and the bank select signal BSD. With such configuration, in some embodiments, when the global precharge signal RE and the bank select signal BSD are at logic high, the output signal of the NAND logic operator 212a is at logic low, thereby the local precharing signal GPREB being at logic low. When the global sense enable signal WLP_SAE and the bank select signal BSD are at logic high, the local sense enable signal GSAE is also at logic high.

As illustrated in FIG. 2, the read assist circuit 220 includes NAND logic operators 220a and 220b, and NOT logic operators 220c, 220d and 220e. The NOT logic operators 220c, 220d and 220e are coupled in series. One of inputs of the NAND logic operator 220a is coupled to an output of the NOT logic operator 212c, and the other one of inputs of the NAND logic operator 220a is coupled to an output of the NOT logic operator 220c. An output of the NAND logic operator 220a is coupled to one of inputs of the NAND logic operator 220b, and is also coupled to an input of the bit cell BC, for outputting the precharge signal PREB to the bit cell BC. An input of the NOT logic operator 220c is coupled to an output of the NOT logic operator 213b, for receiving the local sense enable signal GSAE from the sense enable local unit 213. An output of the NOT logic operator 220c is coupled to an input of the NOT logic operator 220d, and is further coupled to one of inputs of the NAND logic operator 220a, for outputting a first delayed sense enable signal SAEB. An output of the NOT logic operator 220d is coupled to an input of the NOT logic operator 220e, and is also coupled to an input of the sense amplifier circuit 230, for outputting the sense enable signal SAE to the sense amplifier circuit 230. An output of the NOT logic operator 220e is coupled to one of inputs of the NAND logic operator 220b, for outputting a second delayed sense enable signal SAEC.

Furthermore, inputs of the NAND logic operator 220b are coupled to an output of the NAND logic operator 220a and an output of the NOT logic operator 220e, and are configured to receive the precharge signal PREB from the NAND logic operator 220a and the second delayed sense enable signal SAEC from the NOT logic operator 220e. Another input of the NAND logic operator 220b is further configured to receive a bit line enable signal BLEQB, for selecting a corresponding word line to active the corresponding bit line BL and complementary bit line BLB. An output of the NAND logic operator 220b is coupled to the selected word line of the bit cell BC, for outputting a word line enable signal PGB to active the corresponding word line WL.

In some embodiments, the precharge signal PREB and the sense enable signal SAE are referred to as control signals, to read a bit data stored in a bit cell BC arranged in the corresponding memory array in the selected memory bank. The control signals are similar or identical to the local control signals, when the corresponding bit cell BC is selected, in response to the bit line enable signal BLEQB. In various embodiments, the word line enable signal PGB is a combined signal from the precharge signal PREB and the sense enable signal SAE, with the activated bit line enable signal BLEQB.

As mentioned above, the read assist circuit 220 is utilized to generate the precharge signal PREB and the sense enable signal SAE, in response to the local precharge signal GPREB, the local sense enable signal GSAE, and the bit line enable signal BLEQB. In some embodiments, the read assist circuit 220 is utilized in the read operation, for controlling the bit cell BC, that is arranged in the selected memory bank of the memory device 200, to be accessed. Specifically, in the read operation, the precharge signal PREB output from the read assist circuit 220 is configured to precharge the corresponding bit line BL and complementary bit line BLB of the selected bit cell BC. The sense enable signal SAE output from the read assist circuit 220 is configured to activate the sense amplifier circuit 230 to start to distinguish the bit data stored in the bit cell BC. The bit data, in some embodiments, is associated with the voltages on nodes DL_IN and DLB_IN as illustrated in FIG. 2.

In some embodiments, with such configuration as illustrated in FIG. 2, when the corresponding memory bank is selected in the read operation as discussed above with the control circuit 210, the local sense enable signal GSAE is at logic high and the local precharge signal GPREB is at logic low, thereby the first delayed sense enable signal SAEB being at logic low. The sense enable signal SAE is at logic high, and the second delayed sense enable signal SAEC is at logic low. Furthermore, the precharge signal PREB is at logic high operated by the NAND logic operator 220a. When the bit line enable signal BLEQB is also at logic high to select the bit cell BC, the word line enable signal PGB is at logic high operated by the NAND logic operator 220b. Alternatively stated, when the memory bank of the memory device 200 is selected to be read, the global precharge signal RE, the global sense enable signal WLP_SAE, and the bank select signal BSD are activated and at logic high, thereby the local precharge signal GPREB being logic low and the local sense enable signal GSAE being at logic high. The local precharge signal GPREB and the local sense enable signal GSAE are transmitted to the read assist circuit 220, for selecting the bit cell BC to be accessed. When the bit cell BC arranged in the selected memory bank is selected to be read, the bit line enable signal BLEQB is activated and at logic high, thereby the precharge signal PREB and the sense enable signal SAE being at logic high. The precharge signal PREB is transmitted to the selected bit cell BC, for precharging the corresponding bit line BL and complementary bit line BLB which are coupled to the selected bit cell BC. The sense enable signal SAE is transmitted to the sense amplifier circuit 230 which is coupled to the selected bit cell BC, for triggering the sense amplifier circuit 230. Also, the corresponding word line coupled to the selected bit cell BC is activated, in response to the word line enable signal PGB.

The sense amplifier circuit 230 includes a transistor T1 which, in some embodiments, is n-type metal oxide semiconductor transistors (NMOS transistor) and transistors 231 which, in some embodiments, are p-type metal oxide semiconductor transistors (PMOS transistor). A gate terminal of the transistor T1 is coupled to an output of the NOT logic operator 220d, and is configured to receive the sense enable signal SAE. A source terminal of the transistor T1 is coupled to the bit cell BC, and a drain terminal of the transistor T1 is coupled to a reference node which, in some embodiments, is ground. Gates of the transistors 231 are coupled together, and are configured to receive a signal YB for selecting corresponding bit line BL and complementary bit line BLB. Sources of the transistors 231 are coupled to the bit cell BC for receiving data lines DL and DLB. In some embodiments, when the transistors 231 are activated by the signal YB, the data line DL has identical signal that is transmitted to the bit line BL, and the data line DLB has identical signal that is transmitted to the complementary bit line BLB. In some embodiments, the transistors 231 are configured to sense voltages on the bit line BL and the complementary bit line BLB, and to generate a signal (not shown) that represents the bit data stored in the bit cell BC.

The number and arrangement of the sense amplifier circuit 230 are given for illustrative purposes. Various numbers and arrangements of the sense amplifier circuit 230 are within the contemplated scope of the present disclosure. For instance, in various embodiments, in addition to the transistors 231, the sense amplifier circuit 230 shown in FIG. 2 includes more than one sense amplifier.

As illustrated in FIG. 2, in some embodiments, the bit cell BC is a SRAM cell formed by six transistors (6T-SRAM). It is noticed that the bit cell BC shown in FIG. 2 is a demonstrational example. The bit cell BC is not limited thereto 6T-SRAM, and the bit cell BC can be formed by other equivalent SRAM bit cell. For brevity, the read assist circuit 220 and the sense amplifier circuit 230 shown in FIG. 2 illustrates structures relative to adjusting and sensing voltages on the bit line BL and the complementary bit line BLB, respectively. To a person in the art, it is known that the read assist circuit 220 and the sense amplifier circuit 230 further include similar structures corresponding to other bit lines and complement bit lines on different columns, and these similar structures not illustrated in FIG. 2.

Furthermore, transistors T2, T3 and T4 which, in some embodiments, are PMOS transistors, are arranged in and coupled to the bit cell BC. Gate terminals of the transistors T2, T3 and T4 are coupled together and are further coupled to an output of the NAND logic operator 220a, for receiving the precharge signal PREB. Source terminals of the transistors T2, T3 and T4 are coupled to the 6T-SRAM, and drain terminals of the transistors T2, T3 and T4 are also coupled to the 6T-SRAM. In some embodiments, the transistors T2, T3 and T4 are indicated as a precharge assist circuit, and are configured to control the bit cell BC to be precharged in the read operation, in response to the precharge signal PREB.

In some embodiments, with such configuration illustrated in FIG. 2, when the bit cell BC is ready to be accessed in the read operation, voltages of the nodes DL_IN and DLB_IN are pulled up to a relative logic high, in response to the precharge signal PREB, and voltages of the nodes DL_IN and DLB_IN are floating, accordingly. The voltages of the nodes DL_IN and DLB_IN start to decrease, and are pulling to the ground dramatically when the transistor T1 in the sense amplifier circuit 230 is turned on, in response to the sense enable signal SAE. Due to initial voltages on the nodes DL_IN and DLB_IN may have a slight difference, the voltage difference between the nodes DL_IN and DLB_IN is getting bigger and will be large enough to be distinguished by the sense amplifier circuit 230.

The above configuration of the memory device 200 is provided for illustrative purposes. Various implementations of the memory device 200 are within the contemplated scope of the present disclosure. For example, in various embodiments, the precharge local control unit 212, the sense enable local control unit 213, and the read assist circuit 220 are integrated together.

Figure 3:
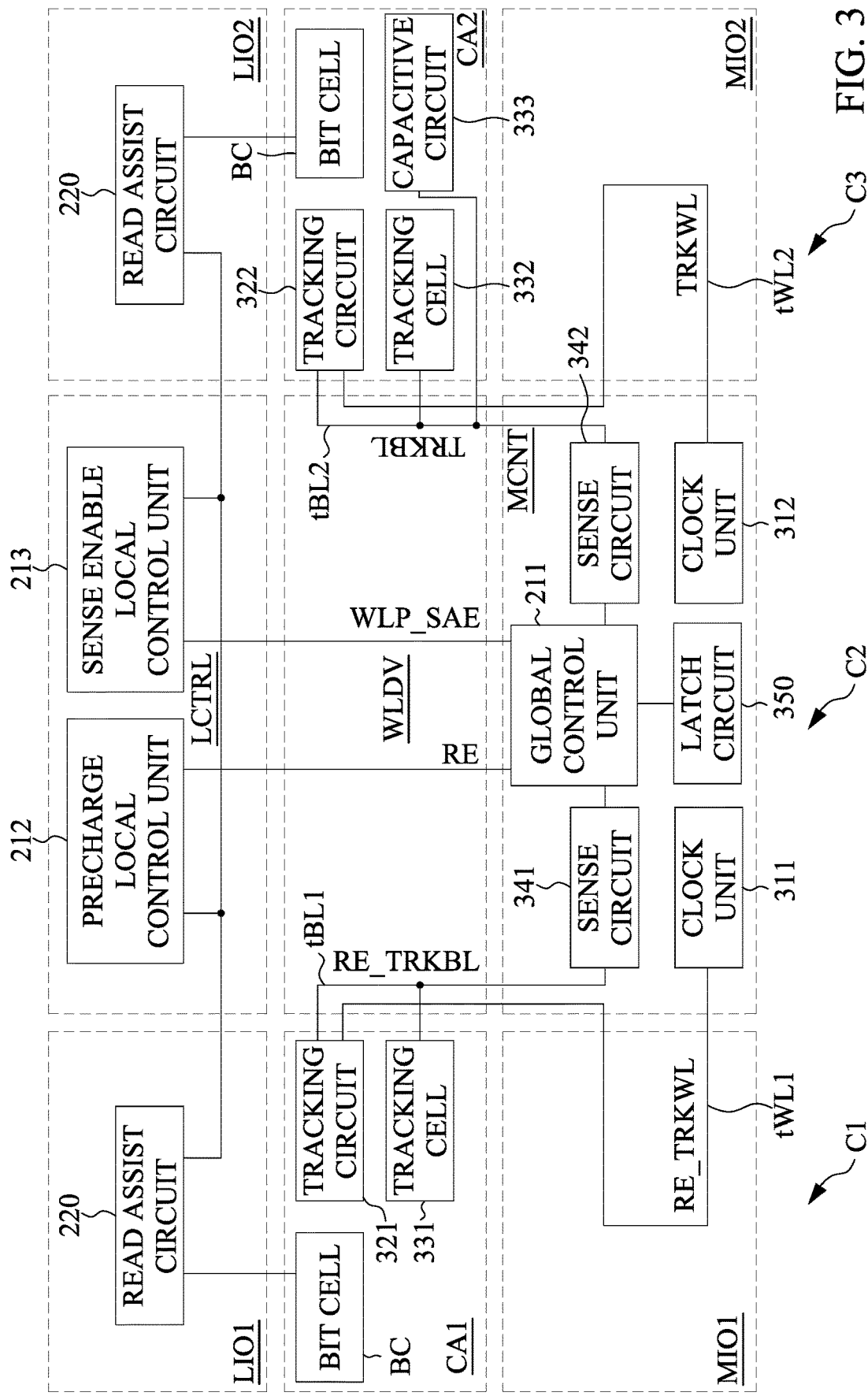
FIG. 3 is a layout diagram illustrating a layout of a memory device corresponding to the memory device shown in FIG. 2, in accordance with some embodiments of the present disclosure.

Reference now made to FIG. 3. FIG. 3 is a layout diagram illustrating a layout 300 of a memory device corresponding to the memory device 200 shown in FIG. 2, in accordance with some embodiments of the present disclosure. With respect to the embodiments of FIG. 2, like elements in FIG. 3 are designated with the same reference numbers for ease of understanding. The layout 300 includes several areas for configurations with various circuits. As shown in FIG. 3, the layout 300 includes a main control area MCNT, a vertical word line driver area WLDV, a local control area LCTRL, main input/output areas MIO1 and MIO2, cell array areas CA1 and CA2, and local input/output areas LIO1 and LIO2. These areas in the layout 300 are arranged in matrix. The main input/output areas MIO1, the cell array area CA1, and the local input/output areas LIO1 are arranged in a first column C1; the main control area MCNT, the vertical word line driver area WLDV, and the local control area LCTRL are arranged in a second column C2 that is adjust to the first column C1; and the main input/output areas MIO2, the cell array area CA2, and the local input/output areas LIO2 are arranged in a third column C3 that is adjust to the second column C2.

With references to FIGS. 2 and 3, the bit cells BC are disposed in the memory arrays CA1 and CA2. The read assist circuits 220 are disposed in the local input/output areas LIO1 and LIO2, respectively. The global control unit 211 is disposed in the main control area MCNT. The precharge local control unit 212 and the sense enable local control unit 213 are disposed in the local control area LCTRL. The sense amplifier circuits 230 are disposed in the memory arrays CA1 and CA2, and for brevity, the sense amplifier circuits 230 are not shown in FIG. 3. The precharge local control unit 212, the sense enable local control unit 213, and the read assist circuits 220 have configurations that are similar to the precharge local control unit 212, the sense enable local control unit 213, and the read assist circuit 220 as discussed with reference to FIG. 2. As such, similar configurations are not further detailed herein.

Compared to FIG. 2, in the layout 300 shown in FIG. 3, the memory device further includes clock units 311 and 312, tracking word lines tWL1 and tWL2, tracking circuits 321 and 322, tracking cells 331 and 332, a capacitive circuit 333, tracking bit lines tBL1 and tBL2, sense circuits 341 and 342, and a latch circuit 350. The clock units 311 and 312, the sense circuits 341 and 342, and the latch circuit 350 are disposed in the main control area MCNT. The tracking circuit 321 and the tracking cell 331 are disposed in the memory array CAL The tracking circuit 322, the tracking cell 332 and the capacitive circuit 333 are disposed in the memory array CA2. The tracking word line tWL1 is disposed across the main control area MCNT, the main input/output areas MIO1 and the vertical word line driver area WLDV. The tracking word line tWL2 is disposed across the main control area MCNT, the main input/output areas MIO2 and the vertical word line driver area WLDV. The tracking bit lines tBL1 and tBL2 are disposed in the vertical word line driver area WLDV.

Figure 4:
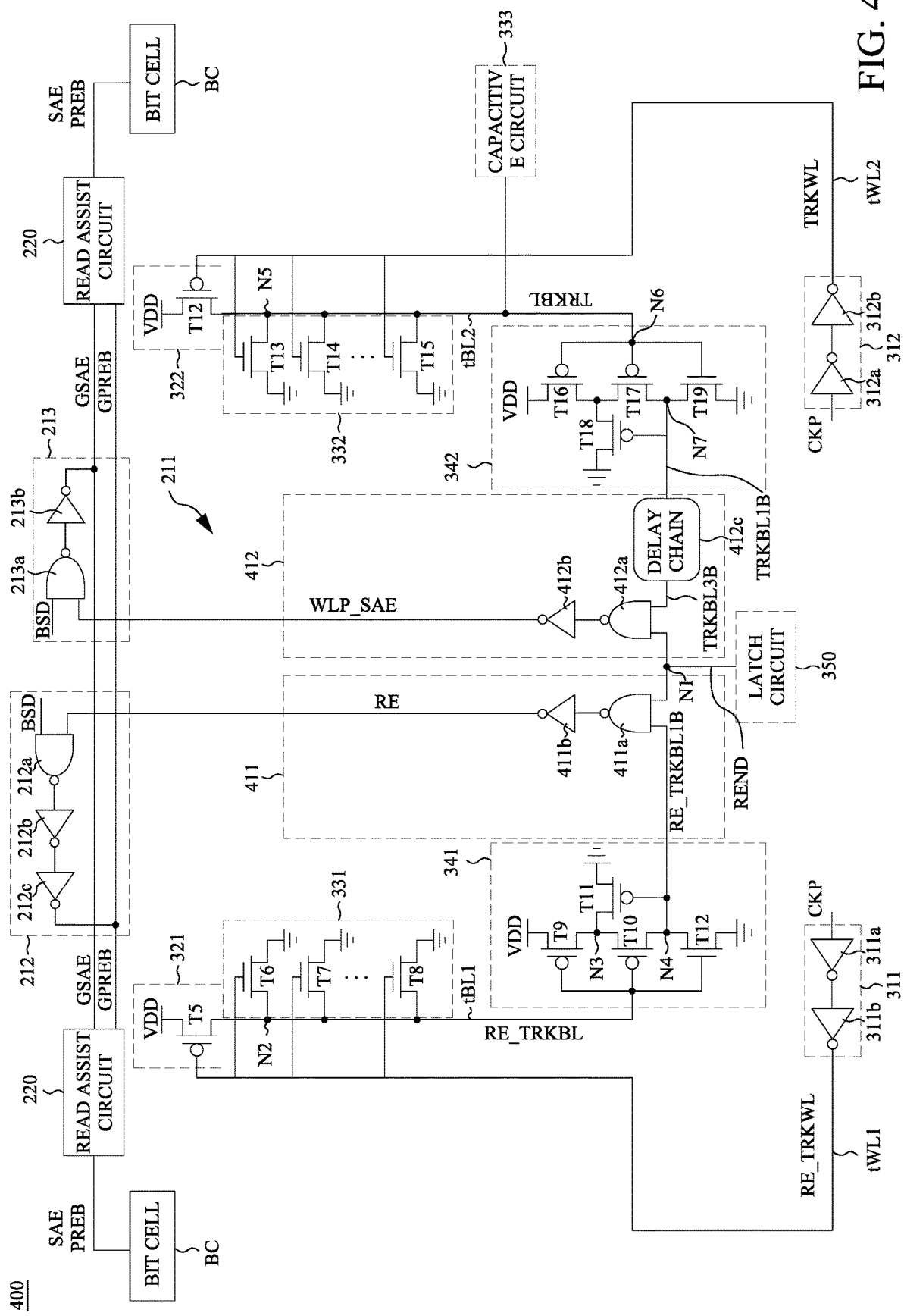
FIG. 4 is an exemplary diagram illustrating structures of a memory device corresponding to the memory device shown in FIG. 3, in accordance with some embodiments of the present disclosure.

As shown in FIG. 3, the clock unit 311 is coupled to the tracking circuit 321 through the tracking word line tWL1, and the tracking word line tWL1 transmits a word line tracking signal RE_TRKWL that is associated with a clock signal (which is shown in FIG. 4). The tracking circuit 321 is further coupled through the tracking bit line tBL1 to the sense circuit 341, and the tracking bit line tBL1 transmits a bit line tracking signal RE_TRKBL that is associated with the tracking cell 331 which is disposed in the memory array CAL The tracking cell 331 is coupled to the tracking bit line tBL1. The sense circuit 341 is further coupled to the global control unit 211. Similarly, the clock unit 312 is coupled to the tracking circuit 322 through the tracking word line tWL2, and the tracking word line tWL2 transmits a word line tracking signal TRKWL that is associated with the clock signal. The tracking circuit 322 is further coupled through the tracking bit line tBL2 to the sense circuit 342, and the tracking bit line tBL2 transmits a bit line tracking signal TRKBL that is associated with the tracking cell 332 and the capacitive circuit 333 which are disposed in the memory array CA2. The tracking cell 332 and the capacitive circuit 333 are coupled to the tracking bit line tBL2. The sense circuit 342 is further coupled to the global control unit 211.

Moreover, the global control unit 211 is coupled to the sense circuits 341 and 342, and the latch circuit 350. The global control unit 211 is further coupled to and configured to transmit the global precharge signal RE to the precharge local control unit 212. The global control unit 211 is also coupled to and configured to transmit the global sense enable signal WLP_SAE to the sense enable local control unit 213.

The above configuration of the layout 300 is provided for illustrative purposes. Various implementations of the memory device corresponding to the layout 300 are within the contemplated scope of the present disclosure.

Reference now made to FIG. 4. FIG. 4 is an exemplary diagram illustrating structures of a memory device 400 corresponding to the memory device represented as the layout 300 shown in FIG. 3, in accordance with some embodiments of the present disclosure. With respect to the embodiments of FIG. 3, like elements in FIG. 4 are designated with the same reference numbers for ease of understanding.

Compared to FIG. 3, the global control unit 211 of the memory device 400 further includes a precharge global control unit 411 and a sense enable global control unit 412. The precharge global control unit 411 is coupled to the sense enable global control unit 412 at a node N1, which is further coupled to an output of the latch circuit 350. The precharge global control unit 411 is also coupled between the sense circuit 341 and the precharge local control unit 212. The sense enable global control unit 412 is also coupled between the sense circuit 342 and the sense enable local control unit 213.

As shown in FIG. 4, the clock unit 311 includes NOT logic operators 311a and 311b. The NOT logic operators 311a and 311b are coupled in series. An input of the NOT logic operator 311a is configured to receive the clock signal CKP which is generated by a clock generator (not shown). An output of the NOT logic operator 311b is coupled to the tracking word line tWL1.

The tracking word line tWL1 is coupled between the NOT logic operator 311b of the clock unit 311 and an input of the tracking circuit 321. The tracking word line tWL1 is configured to provide and transmit the word line tracking signal RE_TRKWL to the tracking circuit 321. Due to a resistor-capacitance (RC) loading on the tracking word line tWL1 being similar to the word line that is coupled with the bit cell BC shown in FIG. 2, the word line tracking signal RE_TRKWL will be similar to a signal on the word line. A length of the tracking word line tWL1 is related to the RC loading, and is further affects duration on the tracking word line tWL1. Alternatively stated, the tracking word line tWL1 is configured to track the signal transmitted on a corresponding word line WL in FIG. 1. In another way to explain, the tracking word line tWL1 is configured to simulate a corresponding word line WL in FIG. 1.

The tracking circuit 321 includes transistor T5 which, in some embodiments, is PMOS transistor, and the tracking cell 331 includes transistors T6, T7 and T8 which, in some embodiments, are NMOS transistor. The transistors T6-T8 are coupled in series. A drain terminal of the transistor T5 is coupled to a source terminal of the transistor T6 at a node N2 which is further coupled to the tracking bit line tBL1. All gate terminals of the transistors T5-T8 are coupled together to the tracking word line tWL1, thereby the transistors T5-T8 being controlled by the word line tracking signal RE_TRKWL.

In some embodiments, an amount of the transistors T6, T7 and T8 in the tracking cell 331 shown in FIG. 4 is substantially equal to an amount of the bit cell BC located on the data lines DL and DLB shown in FIG. 2. Alternatively stated, the transistors T6, T7 and T8 in the tracking cell 331 is able to duplicate (or simulate) a charging or discharging path of one of the bit cells BC from the read assist circuit 121 through a corresponding bit line BL and complementary bit line BLB to the sense amplifier circuit 131 shown in FIG. 1. In another way to explain, the transistors T6, T7 and T8 in the tracking cell 331 shown in FIG. 4 is able to adjust a duration at the node N2 from being at logic high to at logic low. The amount of the transistors T6, T7 and T8 in the tracking cell 331 shown in FIG. 4 is merely for illustration purpose, which is not limited to three herein.

The tracking bit line tBL1 is coupled to the tracking circuit 321 and the tracking cell 331, and is further coupled to an input of the sense circuit 341. The tracking bit line tBL1 is configured to provide and transmit the bit line tracking signal RE_TRKBL to the sense circuit 341. The bit line tracking signal RE_TRKBL is associated with the tracking cell 331.

In some embodiments, an amount of the tracking cell 331 coupled with the tracking bit line tBL1 is substantially equal to an amount of cell rows in the memory array CA1 shown in FIG. 1. For example, with reference to FIG. 1, the memory array CA1 includes N rows which, in some embodiments, is 256 rows, of bit cells BC, the tracking bit line tBL1 is coupled with total 256 tracking cells 331. In some embodiments, the tracking cell 331 can include identical or similar inner structures of the bit cell like the bit cell BC shown in FIG. 2, such that the tracking bit line tBL1 coupled with the tracking cell 331 will have a resistor-capacitance (RC) loading similar to the bit line BL shown in FIG. 2. In this case, as shown in FIG. 4, a charging or discharging speed of the bit line tracking signal RE_TRKBL on the node N2 can be similar to a signal on the bit lines BL1~BLm in the memory array CA1 shown in FIG. 1 or the bit line BL shown in FIG. 2. In various embodiment, an amount of the tracking cell 331 with the tracking bit line tBL1 is greater than an amount of cell rows in the memory array CA1 shown in FIG. 1, thereby the tracking bit line tBL1 having a less RC loading to speed up transmitting the bit line tracking signal RE_TRKBL.

The sense circuit 341 includes transistors T9, T10 and T11 which, in some embodiments, are PMOS transistor, and a transistor T12 which, in some embodiments, is NMOS transistor. The transistors T9, T10 and T12 are coupled in parallel. All gate terminals of the transistors T9, T10 and T12 are coupled together to the tracking bit line tBL1. A drain terminal of the transistor T9 is coupled to a source terminal of the transistor T10 at a node N3 which is further coupled to a source terminal of the transistor T11. A drain terminal of the transistor T10 is coupled to a source terminal of the transistor T12 at a node N4 which is further coupled to a gate terminal of the transistor T11. The node N4 is also indicated as an output of the sense circuit 341, and is further coupled to one of inputs of the precharge global control unit 411. The sense circuit 341 is configured to generate a sense tracking signal RE_TRKBL1B at the node N4, in response to the bit line tracking signal RE_TRKBL.

In some embodiments, as illustrated in FIG. 4, the sense circuit 341 includes a Schmitt trigger. In some embodiments, the Schmitt trigger includes three P-type transistors T9, T10 and T11 and one N-type transistor T12. The Schmitt trigger shown in FIG. 4 is one exemplary structure of Schmitt trigger. The sense circuit 341 is not limited to the illustrated structure of the Schmitt trigger in FIG. 4. The Schmitt trigger includes two threshold voltages (one high threshold voltage and one low threshold voltage).

As shown in FIG. 4, the precharge global control unit 411 includes a NAND logic operator 411a and a NOT logic operator 411b. The NAND logic operator 411a and the NOT logic operator 411b are coupled in series. One inputs of the NAND logic operator 411a is coupled to the node N4, and is configured to receive the sense tracking signal RE_TRKBL1B which is output from the sense circuit 341. The other one of inputs of the NAND logic operator 411a is coupled to the node N1, and is configured to receive a read enable delayed signal REND output from the latch circuit 350. An output of the NAND logic operator 411a is coupled to an input of the NOT logic operator 411b. An output of the NOT logic operator 411b is coupled to one of the inputs of the NAND logic operator 212a in the precharge local control unit 212. The precharge global control unit 411 is configured to generate the global precharge signal RE, in response to the sense tracking signal RE_TRKBL1B and the read enable delayed signal REND.

In some embodiments, with such configuration as illustrated in FIG. 4, when the word line tracking signal RE_TRKWL reach a relative logic high, a voltage of the bit line tracking signal RE_TRKBL on the node N2 is started to be pulled to the ground. Alternatively stated, the voltage on the node N2 is discharged by the transistors T6, T7 and T8. Furthermore, when the voltage on the node N2 is pulled down to logic low, in the sense circuit 341, the transistors T9 and T10 are turned on, and the transistor T12 is turned off, thereby a voltage on the node N4 is pulled up to a reference voltage VDD. Alternatively stated, the voltage on the node N4 is charged by the transistors T9 and T10 in the sense circuit 341. Accordingly, the sense tracking signal RE_TRKBL1B input to the precharge global control unit 411 is at logic high. Moreover, in the read operation, when the read enable delayed signal REND is also at logic high, the global precharge signal RE is at logic high, performed a NAND operation and an inversion operation by the NAND logic operator 411a and the NOT logic operator 411b respectively. Accordingly, the global precharge signal RE is activated as discussed above with reference to FIG. 2.

As mentioned above, the clock unit 311, the tracking word line tWL1, the tracking circuit 321, the tracking bit line tBL1, the sense circuit 341, and the precharge global control unit 411 are utilized to generate the global precharge signal RE. The global precharge signal RE is utilized in the generation of the precharging signal PREB, and the precharging signal PREB is utilized to precharge the bit line BL and the complementary bit line BLB of the selected bit cell BC as shown in FIG. 2, in the read operation.

With continued reference to FIG. 4, similar to the clock unit 311, the clock unit 312 includes NOT logic operators 312a and 312b which are coupled in series. An input of the NOT logic operator 312a is configured to receive the clock signal CKP, and an output of the NOT logic operator 312b is coupled to the tracking word line tWL2.

The tracking word line tWL2 is coupled between the NOT logic operator 312b of the clock unit 312 and an input of the tracking circuit 322. The tracking word line tWL2 is configured to provide and transmit the word line tracking signal TRKWL to the tracking circuit 322. A RC loading on the tracking word line tWL2 is similar to or greater than the word line in the bit cell BC shown in FIG. 2, as such, the word line tracking signal TRKWL will be similar to or have a delay on a signal on the word line. The delay is related to a length of the tracking word line tWL2 that is greater than a length of the word line, in some embodiments. In various embodiments, a length of the tracking word line tWL2 is greater than a length of the tracking word line tWL1, and a length of the tracking word line tWL1 is substantially equal to a length of the word line.

The tracking circuit 322 has configurations that are similar to the tracking circuit 321 as discussed above, and includes transistor T12 of P-type. The tracking cell 332 has configurations that are similar to the tracking cell 331 as discussed above, and includes transistors T13, T14 and T15 of N-type. As such, similar configurations are not further detailed herein. An input of the tracking circuit 322 is indicated as a gate terminal of the transistor T12, and is configured to receive the word line tracking signal TRKWL. An output of the tracking circuit 322 is indicated as a node N5, and is further coupled to the tracking cell 332 for transmitting the bit line tracking signal TRKBL on the tracking bit line tBL2.

The tracking bit line tBL2 has configurations that are similar to the tracking bit line tBL1, and is coupled to tracking circuit 322 and the tracking cell 332, which is further coupled to the capacitive circuit 333 and an input of the sense circuit 342. As illustrated in FIG. 4, in some embodiments, the tracking cell 332 and the capacitive circuit 333 are coupled in parallel with the tracking bit line tBL2. The tracking bit line tBL2 is configured to provide and transmit the bit line tracking signal TRKBL to the sense circuit 342.

In some embodiments, a RC loading is coupled with the tracking bit line tBL2 due to the tracking cell 332, and another RC loading is coupled with the tracking bit line tBL2 due to the capacitive circuit 333. In various embodiments, an amount of the tracking cell 332 with the tracking bit line tBL2 is substantially equal to an amount of cell rows in the memory array CA2 shown in FIG. 1. In some other embodiments, an amount of the tracking cell 332 coupled with the tracking bit line tBL2 is less than an amount of the tracking cell 331 coupled with the tracking bit line tBL1, thereby the tracking bit line tBL2 having a delay on the tracking bit line tBL1. This delay is related to at least an amount different between the tracking cells 331 and 332, or the RC associated with the capacitive circuit 333. Alternatively stated, a RC loading coupled with the tracking bit line tBL1 is greater than a RC loading coupled with the tracking bit line tBL2. Accordingly, the bit line tracking signal TRKBL is slower than the bit line tracking signal RE_TRKBL, according to the same clock signal CKP.

The sense circuit 342 has configurations that are similar to the sense circuit 341 as discussed above, and includes transistors T16, T17 and T18 of P-type, and a transistor T19 of N-type. As such, similar configurations are not further detailed herein. An input of the sense circuit 342 is indicated as a node N6 which is coupled with gate terminals of the transistors T16, T17 and T19, and is configured to receive the bit line tracking signal TRKBL. An output of the sense circuit 342 is indicated as a node N7, and is further coupled to an input of the sense enable global control unit 412. The sense circuit 342 is configured to generate a sense tracking signal TRKBL1B at the node N7, in response to the bit line tracking signal TRKBL.

As shown in FIG. 4, the sense enable global control unit 412 includes a NAND logic operator 412a, a NOT logic operator 412b, and a delay chain circuit 412c. The NAND logic operator 412a, the NOT logic operator 412b, and the delay chain circuit 412c are coupled in series. An input of the delay chain circuit 412c is coupled to the node N7, and is configured to receive the sense tracking signal TRKBL1B output from the node N7 in the sense circuit 342. An output of the delay chain circuit 412c is coupled to one of inputs of the NAND logic operator 412a, and is configured to generate a sense tracking signal TRKBL3B, in response to the sense tracking signal TRKBL1B. The other one of inputs of the NAND logic operator 412a is configured to receive the read enable delayed signal REND output from the latch circuit 350 at the node N1. An output of the NAND logic operator 412a is coupled to an input of the NOT logic operator 412b. An output of the NOT logic operator 412b is coupled to one of the inputs of the NAND logic operator 213a in the sense enable local control unit 213. The sense enable global control unit 412 is configured to generate the global sense enable signal WLP_SAE, in response to the sense tracking signal TRKBL3B which is associated with the sense tracking signal TRKBL1B.

In some embodiments, with such configuration as illustrated in FIG. 4, when the word line tracking signal TRKWL is at logic high, a voltage of the bit line tracking signal TRKBL on the node N5 is started to be pulled to the ground, dominated by the transistors T13-T15. Furthermore, when the voltage on the node N5 is pulled down to logic low, in the sense circuit 342, the transistors T16 and T17 are turned on, and the transistor T19 is turned off, thereby a voltage on the node N7 is pulled up to the reference voltage VDD. Accordingly, the sense tracking signal TRKBL1B input to the sense enable global control unit 412 is at logic high. In addition, the read enable delayed signal REND is at logic high as discussed above, as such, the global sense enable signal WLP_SAE is at logic high, performed through the delay chain circuit 412c, a NAND operation by the NAND logic operator 412a and an inversion operation by the NOT logic operator 412b. Accordingly, the global sense enable signal WLP_SAE is activated as discussed above with reference to FIG. 2.

As mentioned above, the clock unit 312, the tracking word line tWL2, the tracking circuit 322, the capacitive circuit 333, the tracking bit line tBL2, the sense circuit 342, and the sense enable global control unit 412 are utilized to generate the global sense enable signal WLP_SAE. The global sense enable signal WLP_SAE is utilized in the generation of the sense enable signal SAE, and the sense enable signal SAE is utilized to activate the sense amplifier circuit 230 coupled with the selected bit cell BC as shown in FIG. 2, in the read operation.

Figure 5:
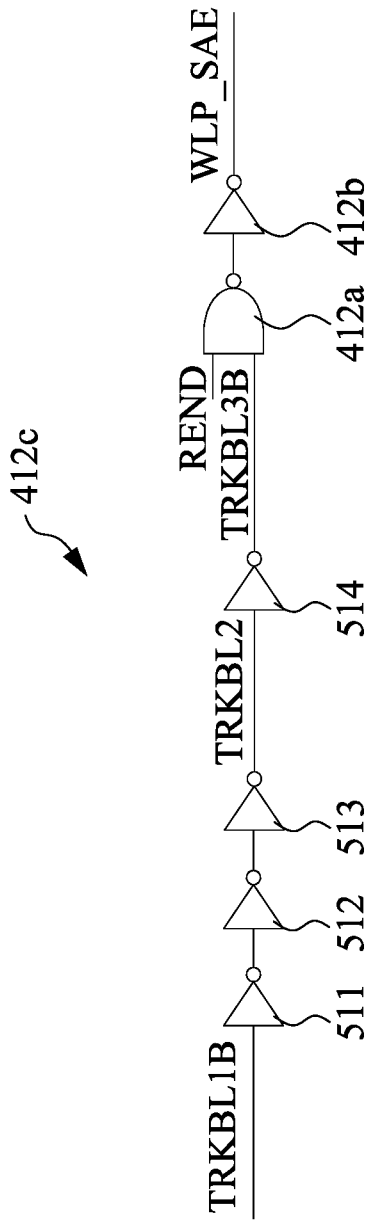
FIG. 5 is an exemplary diagram illustrating structures of a sense enable global control unit corresponding to the sense enable global control unit shown in FIG. 4, in accordance with some embodiments of the present disclosure.

Reference now made to FIG. 5. FIG. 5 is an exemplary diagram illustrating structures of a sense enable global control unit 412 corresponding to the sense enable global control unit 412 shown in FIG. 4, in accordance with some embodiments of the present disclosure. With respect to the embodiments of FIG. 4, like elements in FIG. 5 are designated with the same reference numbers for ease of understanding.

Compared to FIG. 4, as shown in FIG. 5, the delay chain circuit 412c includes several NOT logic operators 511, 512, 513 and 514. The NOT logic operators 511-514 are coupled in series, and are further coupled to the NAND logic operator 412a. An input of the NOT logic operator 511 is coupled to the node N7 (which is shown in FIG. 4), and is configured to receive the sense tracking signal TRKBL1B output from the sense circuit 342. An output of the NOT logic operator 511 is coupled to an input of the NOT logic operator 512. An output of the NOT logic operator 513 is coupled to an input of the NOT logic operator 514, and is configured to generate and transmit a sense tracking delayed signal TRKBL2. An output of the NOT logic operator 514 is coupled to one of inputs of the NAND logic operator 412a, and is configured to generate and transmit the sense tracking signal TRKBL3B.

In some embodiments, with such configuration as illustrated in FIG. 5, when the sense tracking signal TRKBL1B is at logic high as discussed above with reference to FIG. 4, the tracking delayed signal TRKBL2 is at logic low, thereby the sense tracking signal TRKBL3B being at logic high. In some embodiments, when the read enable delayed signal REND is also at logic high, the global sense enable signal WLP_SAE is at logic high, thereby other signals being at corresponding logic levels, as discussed with reference to FIGS. 2 and 4.

In some embodiments, the NOT logic operators 511-514 are operated as invertors, and are configured to generate delays on corresponding output signals. For example, the sense tracking delayed signal TRKBL2 is performed an inversion operation by the NOT logic operators 511-513, in response to the sense tracking signal TRKBL1B. The sense tracking delayed signal TRKBL2 has a delay on the sense tracking signal TRKBL1B, and such delay is associated with an amount of the NOT logic operators 511-513, which is three in such embodiments. Furthermore, the sense tracking signal TRKBL3B is performed an inversion operation by the NOT logic operator 514, in response to the sense tracking delayed signal TRKBL2. The sense tracking signal TRKBL3B has a delay on the sense tracking delayed signal TRKBL2, and also has another delay on the sense tracking signal TRKBL1B. Alternatively stated, the sense tracking signal TRKBL3B is slower than the sense tracking delayed signal TRKBL2, and the sense tracking delayed signal TRKBL2 is slower than the sense tracking signal TRKBL1B.

Figure 6:
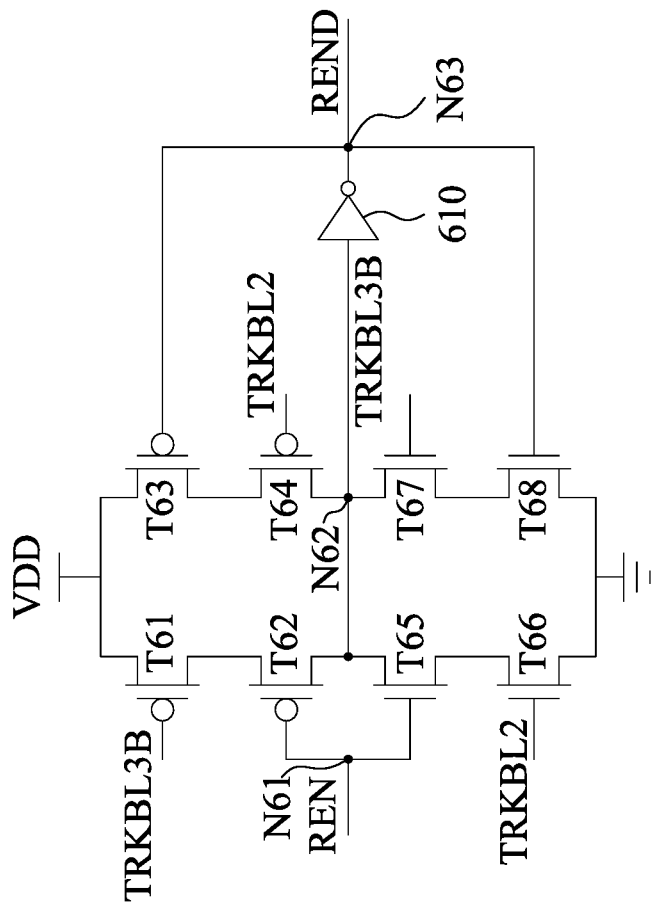
FIG. 6 is an exemplary diagram illustrating structures of a latch circuit corresponding to the latch circuit shown in FIG. 4, in accordance with some embodiments of the present disclosure.

Reference now made to FIG. 6. FIG. 6 is an exemplary diagram illustrating structures of a latch circuit 350 corresponding to the latch circuit 350 shown in FIG. 4, in accordance with some embodiments of the present disclosure. With respect to the embodiments of FIG. 4, like elements in FIG. 6 are designated with the same reference numbers for ease of understanding.

As shown in FIG. 6, the latch circuit 350 includes a NOT logic operator (inverter) 610, transistors T61, T62, T63 and T64 of P-type, and transistors T65, T66, T67 and T68 of N-type. The transistors T61, T62, T65 and T66 are coupled in parallel, and the transistors T63, T64, T67 and T68 are coupled in parallel. The NOT logic operator 610 is coupled to the transistors T62, T63, T64, T65, T67 and T68. The latch circuit 350 is configured to generate the read enable delayed signal REND, in response to a read enable signal REN.

A gate terminal of the transistor T61 is configured to receive the sense tracking signal TRKBL3B. Source terminals of the transistors T61 and T63 are coupled together, and are further coupled to a reference voltage VDD. A drain terminal of the transistor T61 is coupled to a source terminal of the transistor T62. Gate terminals of the transistors T62 and T65 are coupled together at a node N61, and are configured to receive the read enable signal REN. The node N61 is also indicated as an input of the latch circuit 350, in some embodiments. A drain terminal of the transistor T62 is coupled to a source terminal of the transistor T65 at a node N62. A gate terminal of the transistor T66 is configured to receive the sense tracking delayed signal TRKBL2. A source terminal of the transistor T66 is coupled to a drain terminal of the transistor T65. Drain terminals of the transistors T66 and T68 are coupled together, and are further coupled to a reference voltage which, in some embodiments, is the ground.

Moreover, gate terminals of the transistors T63 and T68 are coupled together, and are further coupled to an output of the NOT logic operator 610 at a node N63. A drain terminal of the transistor T63 is coupled to a source terminal of the transistor T64. A gate terminal of the transistor T64 is configured to receive the sense tracking delayed signal TRKBL2. A drain terminal of the transistor T64 is coupled to a source terminal of the transistor T67 at the node N62. A gate terminal of the transistor T67 is configured to receive the sense tracking signal TRKBL3B. A drain terminal of the transistor T67 is coupled to a source terminal of the transistor T68. Furthermore, an input of the NOT logic operator 610 is coupled to source/drain terminals of the transistors T62 and T65 at the node N62. An output of the NOT logic operator 610 is coupled to gate terminals of the transistors T63 and T68 at the node N63, and is configured to output the read enable delayed signal REND. The node N63 is also indicated as an output of the latch circuit 350, in some embodiments. In some other embodiments, the NOT logic operator 610 is operated as an invertor, and is configured to generate a delay on signal output at the node N63.

In some embodiments, with the configurations of the latch circuit 350 shown in FIG. 6 and the sense enable global control unit 412 shown in FIG. 5 discussed above, in the read operation, the sense tracking signal TRKBL1B is at logic high, the tracking delayed signal TRKBL2 is at logic low, and the sense tracking signal TRKBL3B is at logic high. When the read enable signal REN is at logic high, the transistors T61, T62 and T66 are turned off, and the transistors T64, T65 and T67 are turned on, thereby the voltage on the node N62 being at logic low. As such, the voltage on the node N63 is at logic high due to the NOT logic operator 610, thereby the transistor T63 being turned off and the transistor T68 being turned on. Due to the transistors T67 and T68 being turned on, the voltage on the node N62 is kept at logic low, thereby the voltage on the node N63 being kept at logic high. Accordingly, the read enable delayed signal REND is at logic high, as discussed with reference to FIG. 4.

In some embodiments, the transistors T62 and T65 are operated as a latch, and are configured to latch the read enable signal REN at the node N62. The node N62 is also indicated as an output of such latch. In some other embodiments, the inverter 610 is also operated as a latch with a self-timing loop, to postpone the previous bit data at the node N62. Therefore, the read enable delayed signal REND is a double-latched signal generated by the transistors T62 and T65, and the inverter 610. In various embodiments, with such configuration shown in FIG. 6, the read enable delayed signal REND has a delay on the read enable signal REN, and such delay is associated with the transistors T62 and T65, and the NOT logic operator 610. Furthermore, the delay is also related to signals input to the gate terminals of the transistors T61-T68. These signals include the sense tracking delayed signal TRKBL2 and the sense tracking signal TRKBL3B. Alternatively stated, the read enable delayed signal REND is later than the read enable signal REN, controlled by the sense tracking delayed signal TRKBL2 and the sense tracking signal TRKBL3B, wherein the sense tracking signal TRKBL3B is related to the sense tracking delayed signal TRKBL2 as discussed with reference to FIG. 5. In other way to explain, the sense tracking delayed signal TRKBL2 is utilized to latch the read enable signal REN. The delay between the read enable delayed signal REND and the read enable signal REN is generated by latch operation rather than logic delay including, for example, gate delay.

In some embodiments, the read enable signal REN is a latched signal generated by another latch circuit (not shown), in response to a word line enable signal (not shown) and/or the clock signal CKP. The word line enable signal is configured to activate or to select the corresponding word line WL (which is shown in FIG. 2) of the bit cell to be accessed.

Figure 7:
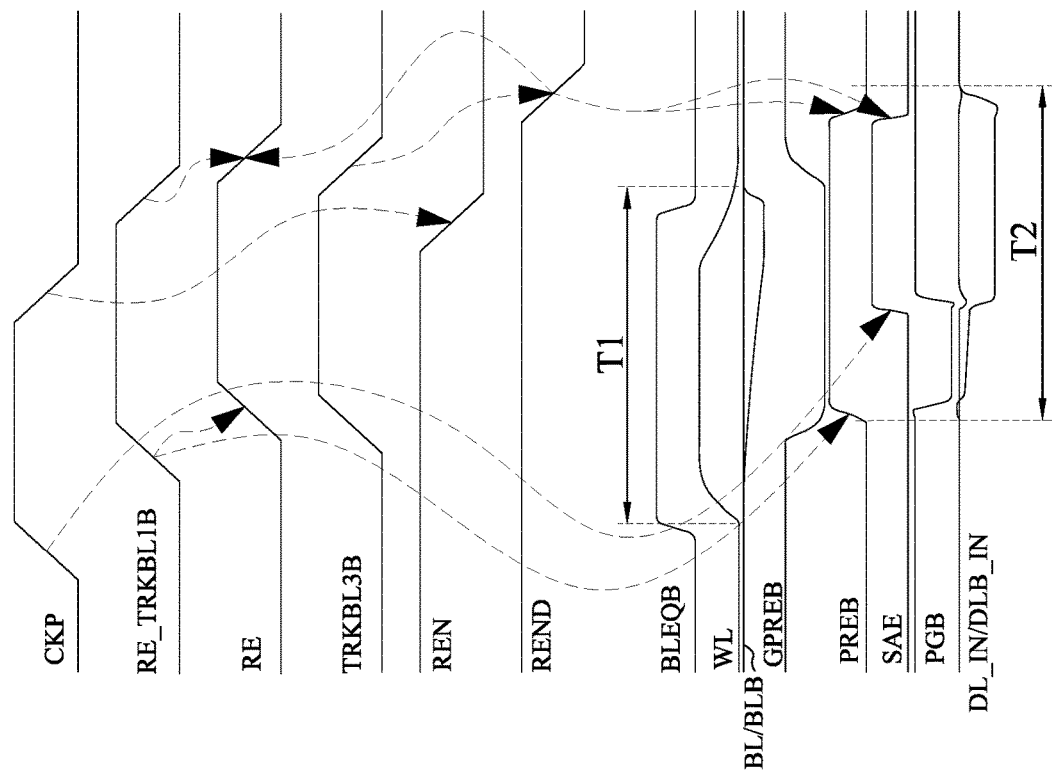
FIG. 7 is signal waveform diagram illustrating a relationship between times on relative signals in the memory device shown in FIGS. 4 to 6, in accordance with some embodiments of the present disclosure.

Reference now made to FIG. 7. FIG. 7 is signal waveform diagram illustrating a relationship between times on relative signals shown in FIGS. 4 to 6, when the bit cell BC in the memory device 400 is in the read operation, in accordance with some embodiments of the present disclosure. With respect to the embodiments of FIGS. 4 to 6, like elements in FIG. 7 are designated with the same reference numbers for ease of understanding. As illustrated in FIG. 7, various signals utilized in the memory device 400 shown in FIG. 4 during the read operation are illustrated. A period T1 is associated with the bit line enable signal BLEQB, the word line WL, and the bit line BL and the complementary bit line BLB. A period T2 is associated with the local precharing signal GPREB, the precharge signal PREB, the sense enable signal SAE, the word line enable signal PGB, and the signals on the nodes DL_IN and DLB_IN. In some embodiments, a period of the bit line enable signal BLEQB dominates duration of the period T1, and a period of the precharge signal PREB dominates duration of the period T2. Alternatively stated, a frequency of the bit line enable signal BLEQB and a length of the period T1 are related and have a negative correlation. A frequency of the precharge signal PREB and a length of the period T2 are related and have a negative correlation.

With references to FIGS. 4 to 7, the clock signal CKP is utilized in the memory device 400 as an initial signals model for generations of other signals for the read operation. The sense tracking signal RE_TRKBL1B is generated by the sense circuit 341, and is associated with the bit line tracking signal RE_TRKBL which is further associated with the clock signal CKP. In some embodiments, with the configurations discussed with FIG. 4, the sense tracking signal RE_TRKBL1B has a delay on the clock signal CKP, and also has features relative to the tracking cell 331 and the tracking word line tWL1.

The global precharge signal RE is generated by the precharge global control unit 411, in response to the sense tracking signal RE_TRKBL1B and the read enable delayed signal REND. As illustrated in FIG. 7, the global precharge signal RE is generated, in response to a rising edge of the sense tracking signal RE_TRKBL1B, and also in response to a falling edge of the sense tracking signal RE_TRKBL1B. The falling edge of the global precharge signal RE is further associated with a falling edge of the read enable delayed signal REND, thereby the global precharge signal RE lasting a while before being pull low by the falling edge of the sense tracking signal RE_TRKBL1B.

Furthermore, the sense tracking signal RE_TRKBL1B and the read enable delayed signal REND are also related to the precharge signal PREB. The precharge signal PREB is generated by the read assist circuit 220, in response to a rising edge of the sense tracking signal RE_TRKBL1B, and also in response to a falling edge of the read enable delayed signal REND. Alternatively stated, a front-edge of the precharge signal PREB is pulled to logic high, in response to a front-edge of the sense tracking signal RE_TRKBL1B. It is known that the sense tracking signal RE_TRKBL1B is a signal tracking/duplicating (simulating) word line WL and bit line BL/complementary bit line BLB coupled with the selected bit cell BC, as discussed with reference to FIG. 4. Accordingly, the precharge signal PREB is adaptive to the bit cells BC in the memory device 400. In addition, the front-edge of the precharge signal PREB may be pulled back to reduce the duration of the period T2, by adjusting a length of the tracking word line tWL1, and/or an amount of the tracking cell 331. Therefore, the frequency of the precharge signal PREB may be increased, thereby the read operation of the memory device 400 being improved accordingly. On the other hand, a back-edge of the precharge signal PREB is pulled down to logic low, in response to a back-edge of the read enable delayed signal REND. The precharge signal PREB is pull high at the beginning of the period T2, and stays high for a while before being pulled low. Accordingly, a pulse width of the precharge signal PREB is long enough, to guarantee that the read operation is available. Accordingly, the voltages of the nodes DL_IN and DLB_IN in the bit cell BC shown in FIG. 2 are available to be accessed during the period T2, due to the bit cell BC being activated in response to the precharge signal PREB.

The sense tracking signal TRKBL3B is generated by the delay chain circuit 412c. The read enable delayed signal REND is generated by the latch circuit 350, according to the sense tracking signal TRKBL3B and the read enable signal REN. In some embodiments, with reference to FIGS. 6 and 7, when the sense tracking signal TRKBL3B is from logic high going to logic low, the read enable signal REN is already at logic low, and the tracking delayed signal TRKBL2 is at logic high operated by the sense enable global control unit 412 shown in FIG. 5. Thereby, the transistors T61, T62 and T66 are turned on, and the transistors T64, T65 and T67 are turned off. As such, the voltage on the node N62 is still at logic low because the transistors T61 and T62 are turned on, thereby the voltage on the node N63 is still at logic high due to the NOT operator 610, and the transistor T63 being turned off and the transistor T68 being turned on. Accordingly, even if the read enable signal REN is pulled to logic low, the read enable delayed signal REND is kept at logic high for a while, until the voltage on the node N62 is pulled to logic high by the transistors T61 and T62. Accordingly, the read enable delayed signal REND has a postpone time compared to the read enable signal REN, and thus is later than the read enable signal REN. Furthermore, a back-edge of the read enable delayed signal REND is related to the sense tracking signal TRKBL3B. Alternatively stated, the read enable delayed signal REND is generated, in response to a falling edge of the sense tracking signal TRKBL3B.

In some embodiments, as illustrated in FIG. 7, the read enable signal REN is generated, in response to a falling edge of the clock signal CKP.

The sense enable signal SAE is generated by the read assist circuit 220, in response to a rising edge of the clock signal CKP, and also in response to a falling edge of the read enable delayed signal REND. As illustrated in FIG. 7, a front-edge of the sense enable signal SAE is later than a front-edge of the precharge signal PREB. It is due to the operations including the transmission of the tracking word line tWL2 and the tracking bit line tBL2, and the delay chain circuit 412c. Accordingly, the voltage difference between the nodes DL_IN and DLB_IN in the bit cell BC shown in FIG. 2 is available to be read and distinguished, due to the sense amplifier circuit 230 being activated in response to the sense enable signal SAE.

The word line enable signal PGB is generated by the read assist circuit 220, and is a combined signal from the precharge signal PREB and the sense enable signal SAE. A rising edge of the word line enable signal PGB reflects the beginning of the sense amplifier circuit 230 being activated, during the period T2. In some embodiments, as illustrated in FIG. 7, in the period T2, a pulse width of the word line enable signal PGB is substantially equal to twenty percent of a pulse width of the precharge signal PREB.

Figure 8:
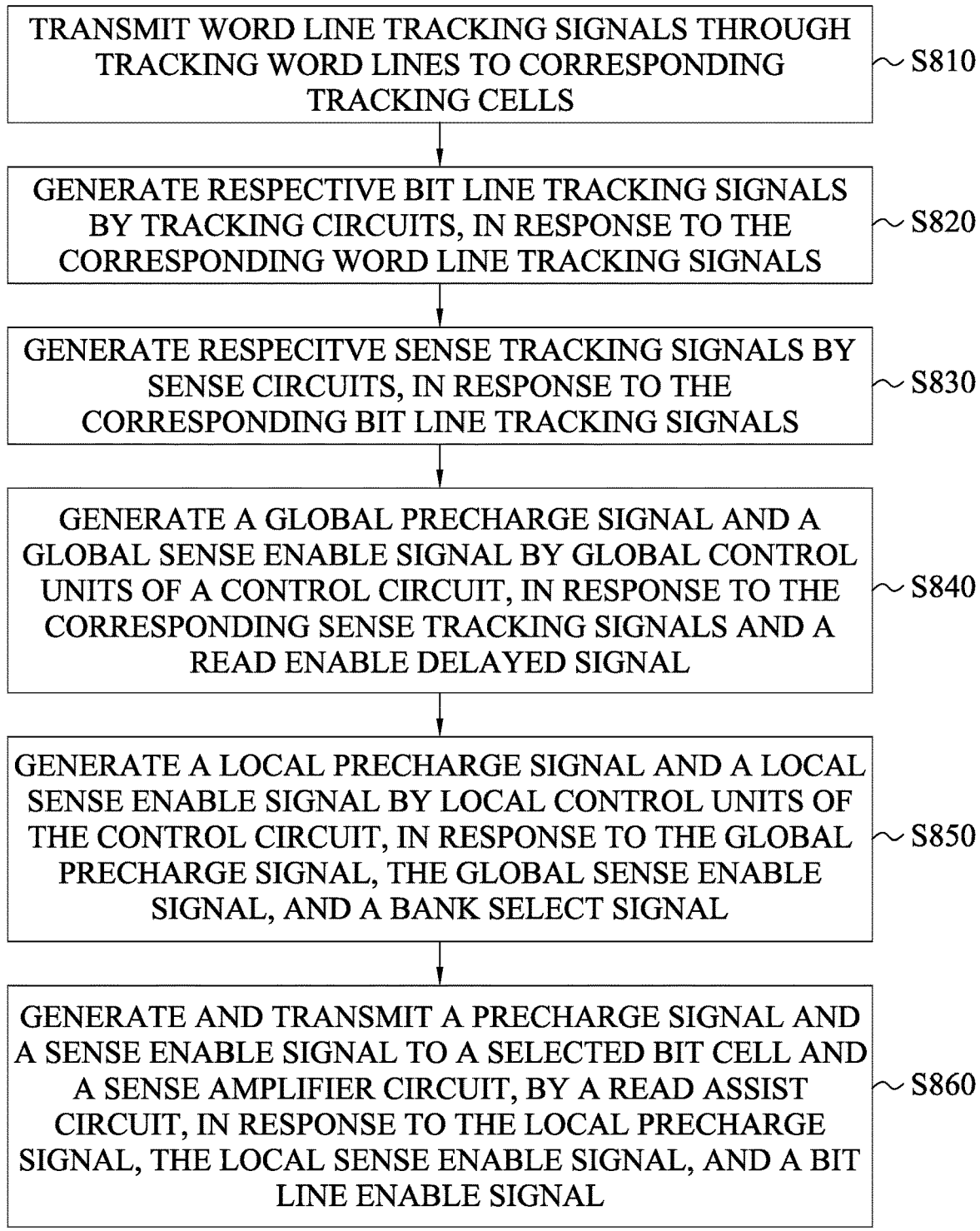
FIG. 8 is a flow chart of a method for operating a memory device corresponding to the memory device shown in FIG. 4, in accordance with some embodiments of the present disclosure.

Reference now made to FIG. 8. FIG. 8 is a flow chart of a method 800 for operating a memory device corresponding to the memory device 400 shown in FIG. 4, in accordance with some embodiments of the present disclosure. Following illustrations of the method 800 in FIG. 8 with reference to the memory device 400 shown in FIG. 4 include exemplary operations. However, the operations in FIG. 8 are not necessarily performed in the order shown. Alternatively stated, operations may be added, replaced, changed order, and/or eliminated as appropriate, in accordance with the spirit and scope of various embodiments of the present disclosure.

In operation S810, word line tracking signals are transmitted through tracking word lines to corresponding tracking circuits. For illustration, as shown in FIG. 4, to generate the precharge signal PREB, the word line tracking signal RE_TRKWL is transmitted through the tracking word line tWL1 to the tracking circuit 321. In addition, for generation of the sense enable signal SAE, the word line tracking signal TRKWL is transmitted through the tracking word line tWL2 to the tracking circuit 322.

In operation S820, tracking circuits generate respective bit line tracking signals, in response to the corresponding word line tracking signals. The bit line tracking signals are associated with corresponding tracking cells arranged in memory arrays of the memory device. For illustration, as shown in FIG. 4, to generate the precharge signal PREB, the tracking circuit 321 generates the bit line tracking signal RE_TRKBL, in response to the word line tracking signal RE_TRKWL. The bit line tracking signal RE_TRKBL is associated with the tracking cell 331 that is arranged in the memory array CA1 (which is shown in FIG. 3) in the memory device 400. In addition, for generation of the sense enable signal SAE, the tracking circuit 322 generates the bit line tracking signal TRKBL, in response to the word line tracking signal TRKWL. The bit line tracking signal TRKBL is associated with the tracking cell 332 and the capacitive circuit 333 that are arranged in the memory array CA2 (which is shown in FIG. 3) in the memory device 400. With such configurations, the bit line tracking signal TRKBL is later than the bit line tracking signal RE_TRKBL, which is also discussed with reference to FIG. 4.

In operation S830, sense circuits generate respective sense tracking signals, in response to the corresponding bit line tracking signals. For illustration, as shown in FIG. 4, to generate the precharge signal PREB, the sense circuit 341 generates the sense tracking signal RE_TRKBL1B, in response to the bit line tracking signal RE_TRKBL. In addition, for generation of the sense enable signal SAE, the sense circuit 342 generates the sense tracking signal TRKBL1B, in response to the bit line tracking signal TRKBL.

In operation S840, global control units of a control circuit generate a global precharge signal and a global sense enable signal, in response to the corresponding sense tracking signals and a read enable delayed signal. For illustration, as shown in FIGS. 4 and 7, to generate the precharge signal PREB, the global control unit 211 of the control circuit 210 generates the global precharge signal RE, in response to the sense tracking signal RE_TRKBL1B and the read enable delayed signal REND. In addition, for generation of the sense enable signal SAE, the global control unit 211 of the control circuit 210 generates the global sense enable signal WLP_SAE, in response to the sense tracking signal TRKBL1B and the read enable delayed signal REND. Specifically, the global precharge signal RE is generated by the precharge global control unit 411 in the global control unit 211, in response to a rising edge of the sense tracking signal RE_TRKBL1B and a falling edge of the read enable delayed signal REND. The global sense enable signal WLP_SAE is generated by the sense enable global control unit 412 in the global control unit 211, in response to a rising edge of the sense tracking signal TRKBL1B and a falling edge of the read enable delayed signal REND.

In operation S850, local control units of the control circuit generate a local precharging signal and a local sense enable signal, in response to the global precharge signal, the global sense enable signal, and a bank select signal. For illustration, as shown in FIGS. 2 and 4, to generate the precharge signal PREB, the precharge local control unit 212 of the control circuit 210 generates the local precharge signal GPREB, in response to the global precharge signal RE and the bank select signal BSD. In addition, for generation of the sense enable signal SAE, the sense enable local control unit 213 of the control circuit 210 generates the local sense enable signal GSAE, in response to the global sense enable signal WLP_SAE and the bank select signal BSD.

In operation S860, a read assist circuit generates and transmits a precharge signal and a sense enable signal to a selected bit cell and a sense amplifier circuit, in response to the local precharing signal, the local sense enable signal, and a bit line enable signal. For illustration, as shown in FIGS. 2 and 4, the read assist circuit 220 generates and transmits the precharge signal PREB to the bit cell BC, in response to the local precharge signal GPREB and the bit line enable signal BLEQB. Furthermore, the read assist circuit 220 generates and transmits the sense enable signal SAE to the sense amplifier circuit 230, in response to the local sense enable signal GSAE and the bit line enable signal BLEQB. Accordingly, the selected bit cell BC is available to be read.

Figure 9:
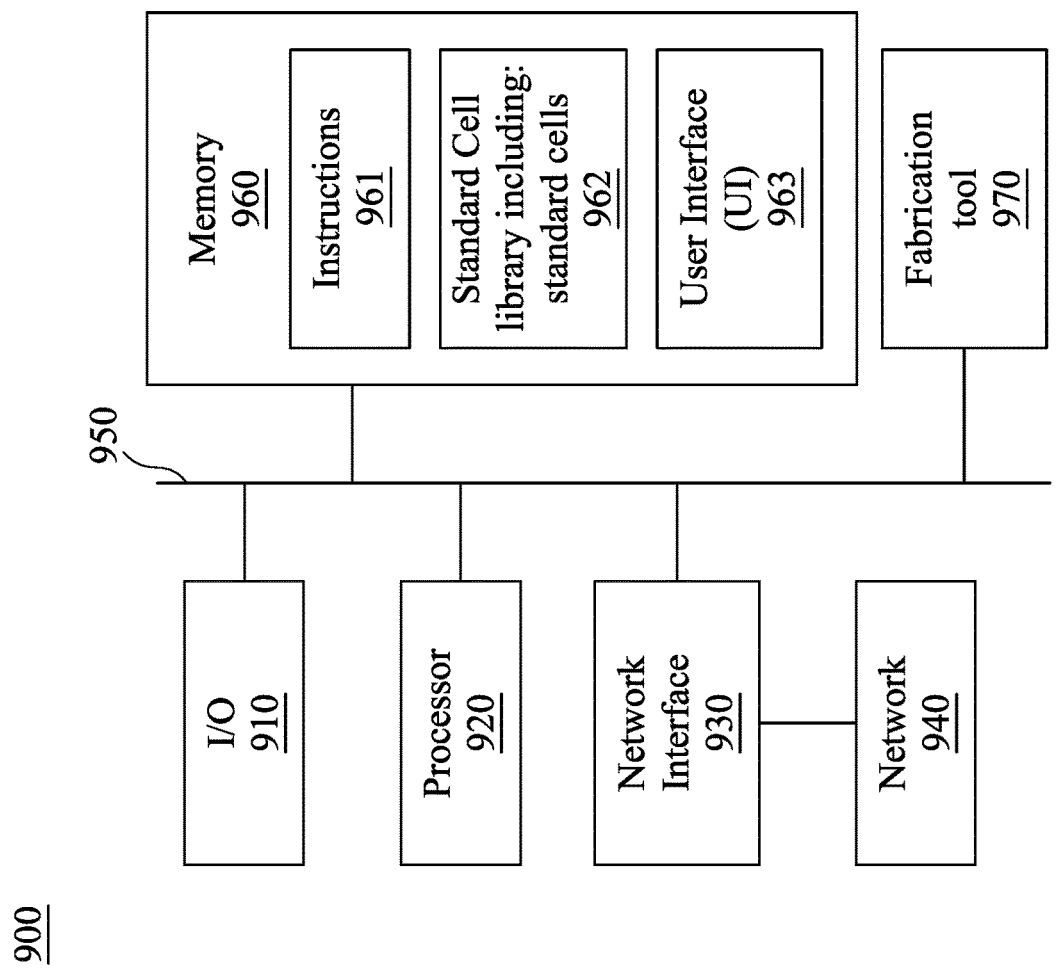
FIG. 9 is a block diagram of a system for designing an IC layout design, in accordance with some embodiments of the present disclosure.

Reference is now made to FIG. 9. FIG. 9 is a block diagram of an electronic design automation (EDA) system 900 for designing the integrated circuit layout design, in accordance with some embodiments of the present disclosure. EDA system 900 is configured to implement one or more operations of the method 800 disclosed in FIG. 8, and further explained in conjunction with FIGS. 2 to 6. In some embodiments, EDA system 900 includes an APR system.

In some embodiments, EDA system 900 is a general purpose computing device including a hardware processor 920 and a non-transitory, computer-readable storage medium 960. Storage medium 960, amongst other things, is encoded with, i.e., stores, computer program code (instructions) 961, i.e., a set of executable instructions. Execution of instructions 961 by hardware processor 920 represents (at least in part) an EDA tool which implements a portion or all of, e.g., the method 800.

The processor 920 is electrically coupled to computer-readable storage medium 960 via a bus 950. The processor 920 is also electrically coupled to an I/O interface 910 and a fabrication tool 970 by bus 950. A network interface 930 is also electrically connected to processor 920 via bus 950. Network interface 930 is connected to a network 940, so that processor 920 and computer-readable storage medium 960 are capable of connecting to external elements via network 940. The processor 920 is configured to execute computer program code 961 encoded in computer-readable storage medium 960 in order to cause EDA system 900 to be usable for performing a portion or all of the noted processes and/or methods. In one or more embodiments, processor 920 is a central processing unit (CPU), a multi-processor, a distributed processing system, an application specific integrated circuit (ASIC), and/or a suitable processing unit.

In one or more embodiments, computer-readable storage medium 960 is an electronic, magnetic, optical, electromagnetic, infrared, and/or a semiconductor system (or apparatus or device). For example, computer-readable storage medium 960 includes a semiconductor or solid-state memory, a magnetic tape, a removable computer diskette, a random access memory (RAM), a read-only memory (ROM), a rigid magnetic disk, and/or an optical disk. In one or more embodiments using optical disks, computer-readable storage medium 960 includes a compact disk-read only memory (CD-ROM), a compact disk-read/write (CD-R/W), and/or a digital video disc (DVD).

In one or more embodiments, storage medium 960 stores computer program code 961 configured to cause EDA system 900 (where such execution represents (at least in part) the EDA tool) to be usable for performing a portion or all of the noted processes and/or methods. In one or more embodiments, storage medium 960 also stores information which facilitates performing a portion or all of the noted processes and/or methods. In one or more embodiments, storage medium 960 stores library 962 of standard cells including such standard cells as disclosed herein, for example, a cell including transistors T1-T19 and T61-T68 discussed above with respect to FIGS. 2, 4 and 6.

EDA system 900 includes I/O interface 910. I/O interface 910 is coupled to external circuitry. In one or more embodiments, I/O interface 910 includes a keyboard, keypad, mouse, trackball, trackpad, touchscreen, and/or cursor direction keys for communicating information and commands to processor 920.

EDA system 900 also includes network interface 930 coupled to processor 920. Network interface 930 allows EDA system 900 to communicate with network 940, to which one or more other computer systems are connected. Network interface 930 includes wireless network interfaces such as BLUETOOTH, WIFI, WIMAX, GPRS, or WCDMA; or wired network interfaces such as ETHERNET, USB, or IEEE-1364. In one or more embodiments, a portion or all of noted processes and/or methods, is implemented in two or more systems 900.

EDA system 900 also includes the fabrication tool 970 coupled to the processor 920. The fabrication tool 970 is configured to fabricate integrated circuits, including, for example, the memory device 100 illustrated in FIG. 1, based on the design files processed by the processor 920 and/or the IC layout designs as discussed above.

EDA system 900 is configured to receive information through I/O interface 910. The information received through I/O interface 910 includes one or more of instructions, data, design rules, libraries of standard cells, and/or other parameters for processing by processor 920. The information is transferred to processor 920 via bus 950. EDA system 900 is configured to receive information related to a UI through I/O interface 910. The information is stored in computer-readable medium 960 as user interface (UI) 963.

In some embodiments, a portion or all of the noted processes and/or methods is implemented as a standalone software application for execution by a processor. In some embodiments, a portion or all of the noted processes and/or methods is implemented as a software application that is a part of an additional software application. In some embodiments, a portion or all of the noted processes and/or methods is implemented as a plug-in to a software application. In some embodiments, at least one of the noted processes and/or methods is implemented as a software application that is a portion of an EDA tool. In some embodiments, a portion or all of the noted processes and/or methods is implemented as a software application that is used by EDA system 900. In some embodiments, a layout diagram which includes standard cells is generated using a tool such as VIRTUOSO® available from CADENCE DESIGN SYSTEMS, Inc., or another suitable layout generating tool.

In some embodiments, the processes are realized as functions of a program stored in a non-transitory computer readable recording medium. Examples of a non-transitory computer readable recording medium include, but are not limited to, external/removable and/or internal/built-in storage or memory unit, for example, one or more of an optical disk, such as a DVD, a magnetic disk, such as a hard disk, a semiconductor memory, such as a ROM, a RAM, a memory card, and the like.

Figure 10:
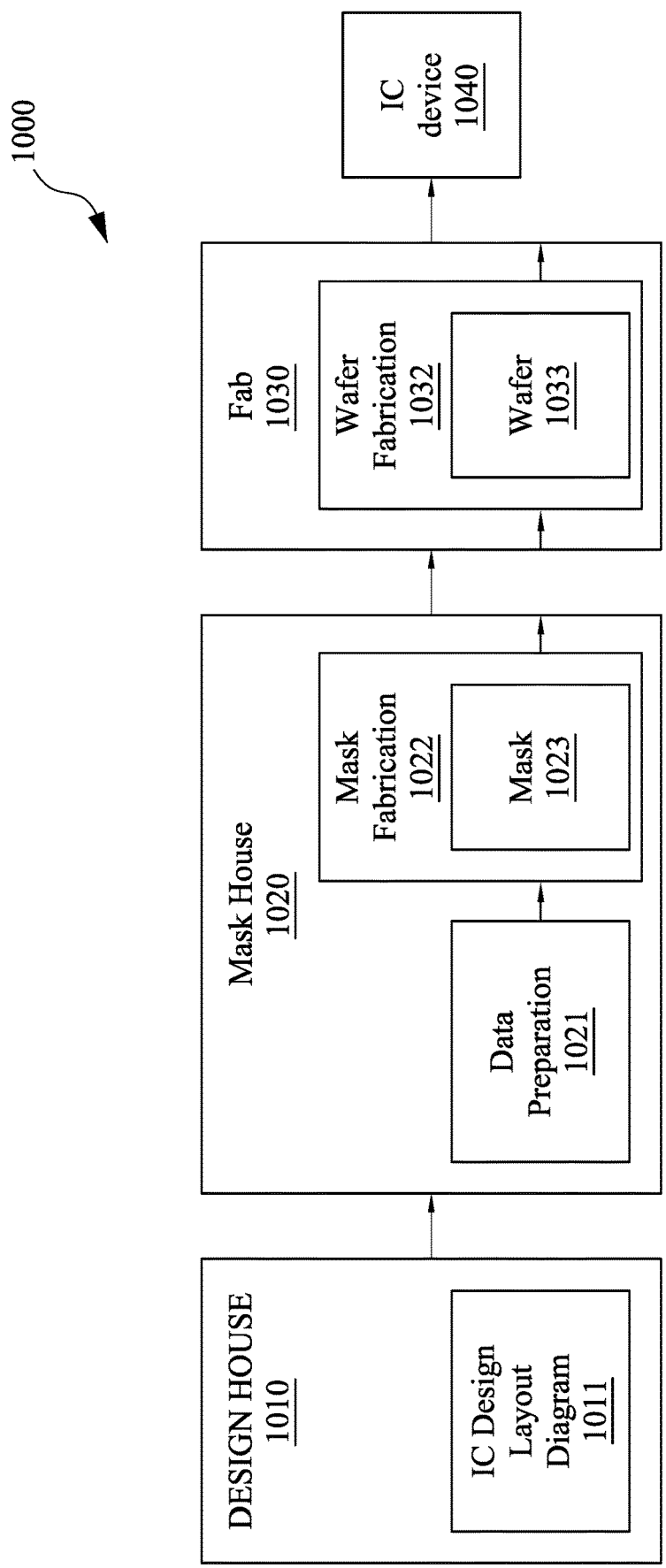
FIG. 10 is a block diagram of an IC manufacturing system, and an IC manufacturing flow associated therewith, in accordance with some embodiments of the present disclosure.

FIG. 10 is a block diagram of IC manufacturing system 1000, and an IC manufacturing flow associated therewith, in accordance with some embodiments. In some embodiments, based on a layout diagram, at least one of (A) one or more semiconductor masks or (B) at least one component in a layer of a semiconductor integrated circuit is fabricated using IC manufacturing system 1000.

In FIG. 10, IC manufacturing system 1000 includes entities, such as a design house 1010, a mask house 1020, and an IC manufacturer/fabricator ("fab") 1030, that interact with one another in the design, development, and manufacturing cycles and/or services related to manufacturing an IC device 1040. The entities in IC manufacturing system 1000 are connected by a communications network. In some embodiments, the communications network is a single network. In some embodiments, the communications network is a variety of different networks, such as an intranet and the Internet. The communications network includes wired and/or wireless communication channels. Each entity interacts with one or more of the other entities and provides services to and/or receives services from one or more of the other entities. In some embodiments, two or more of design house 1010, mask house 1020, and IC fab 1030 is owned by a single larger company. In some embodiments, two or more of design house 1010, mask house 1020, and IC fab 1030 coexist in a common facility and use common resources.

Design house (or design team) 1010 generates an IC design layout diagram 1011. IC design layout diagram 1011 includes various geometrical patterns, for example, an IC layout design depicted in FIG. 3, designed for an IC device 1040, for example, memory device, discussed above with respect to FIG. 2, FIG. 4, FIG. 5, and/or FIG. 6. The geometrical patterns correspond to patterns of metal, oxide, or semiconductor layers that make up the various components of IC device 1040 to be fabricated. The various layers combine to form various IC features. For example, a portion of IC design layout diagram 1011 includes various IC features, such as an active region, gate electrode, source and drain, conductive segments or vias of an interlayer interconnection, to be formed in a semiconductor substrate (such as a silicon wafer) and various material layers disposed on the semiconductor substrate. Design house 1010 implements a proper design procedure to form IC design layout diagram 1011. The design procedure includes one or more of logic design, physical design or place and route. IC design layout diagram 1011 is presented in one or more data files having information of the geometrical patterns. For example, IC design layout diagram 1011 can be expressed in a GDSII file format or DFII file format.

Mask house 1020 includes data preparation 1021 and mask fabrication 1022. Mask house 1020 uses IC design layout diagram 1011 to manufacture one or more masks 1023 to be used for fabricating the various layers of IC device 1040 according to IC design layout diagram 1011. Mask house 1020 performs mask data preparation 1021, where IC design layout diagram 1011 is translated into a representative data file ("RDF"). Mask data preparation 1021 provides the RDF to mask fabrication 1022. Mask fabrication 1022 includes a mask writer. A mask writer converts the RDF to an image on a substrate, such as a mask (reticle) 1023 or a semiconductor wafer 1033. The IC design layout diagram 1011 is manipulated by mask data preparation 1021 to comply with particular characteristics of the mask writer and/or requirements of IC fab 1030. In FIG. 10, data preparation 1021 and mask fabrication 1022 are illustrated as separate elements. In some embodiments, data preparation 1021 and mask fabrication 1022 can be collectively referred to as mask data preparation.

In some embodiments, data preparation 1021 includes optical proximity correction (OPC) which uses lithography enhancement techniques to compensate for image errors, such as those that can arise from diffraction, interference, other process effects and the like. OPC adjusts IC design layout diagram 1011. In some embodiments, data preparation 1021 includes further resolution enhancement techniques (RET), such as off-axis illumination, sub-resolution assist features, phase-shifting masks, other suitable techniques, and the like or combinations thereof. In some embodiments, inverse lithography technology (ILT) is also used, which treats OPC as an inverse imaging problem.

In some embodiments, data preparation 1021 includes a mask rule checker (MRC) that checks the IC design layout diagram 1011 that has undergone processes in OPC with a set of mask creation rules which contain certain geometric and/or connectivity restrictions to ensure sufficient margins, to account for variability in semiconductor manufacturing processes, and the like. In some embodiments, the MRC modifies the IC design layout diagram 1011 to compensate for limitations during mask fabrication 1022, which may undo part of the modifications performed by OPC in order to meet mask creation rules.

In some embodiments, data preparation 1021 includes lithography process checking (LPC) that simulates processing that will be implemented by IC fab 1030 to fabricate IC device 1040. LPC simulates this processing based on IC design layout diagram 1011 to create a simulated manufactured device, such as IC device 1040. The processing parameters in LPC simulation can include parameters associated with various processes of the IC manufacturing cycle, parameters associated with tools used for manufacturing the IC, and/or other aspects of the manufacturing process. LPC takes into account various factors, such as aerial image contrast, depth of focus ("DOF"), mask error enhancement factor ("MEEF"), other suitable factors, and the like or combinations thereof. In some embodiments, after a simulated manufactured device has been created by LPC, if the simulated device is not close enough in shape to satisfy design rules, OPC and/or MRC are be repeated to further refine IC design layout diagram 1011.

It should be understood that the above description of data preparation 1021 has been simplified for the purposes of clarity. In some embodiments, data preparation 1021 includes additional features such as a logic operation (LOP) to modify the IC design layout diagram 1011 according to manufacturing rules. Additionally, the processes applied to IC design layout diagram 1011 during data preparation 1021 may be executed in a variety of different orders.

After data preparation 1021 and during mask fabrication 1022, a mask 1023 or a group of masks 1023 are fabricated based on the modified IC design layout diagram 1011. In some embodiments, mask fabrication 1022 includes performing one or more lithographic exposures based on IC design layout diagram 1011. In some embodiments, an electron-beam (e-beam) or a mechanism of multiple e-beams is used to form a pattern on a mask (photomask or reticle) 1023 based on the modified IC design layout diagram 1011. Mask 1023 can be formed in various technologies. In some embodiments, mask 1023 is formed using binary technology. In some embodiments, a mask pattern includes opaque regions and transparent regions. A radiation beam, such as an ultraviolet (UV) beam, used to expose the image sensitive material layer (for example, photoresist) which has been coated on a wafer, is blocked by the opaque region and transmits through the transparent regions. In one example, a binary mask version of mask 1023 includes a transparent substrate (for example, fused quartz) and an opaque material (for example, chromium) coated in the opaque regions of the binary mask. In another example, mask 1023 is formed using a phase shift technology. In a phase shift mask (PSM) version of mask 1023, various features in the pattern formed on the phase shift mask are configured to have proper phase difference to enhance the resolution and imaging quality. In various examples, the phase shift mask can be attenuated PSM or alternating PSM. The mask(s) generated by mask fabrication 1022 is used in a variety of processes. For example, such a mask(s) is used in an ion implantation process to form various doped regions in semiconductor wafer 1033, in an etching process to form various etching regions in semiconductor wafer 1033, and/or in other suitable processes.

IC fab 1030 includes wafer fabrication 1032. IC fab 1030 is an IC fabrication business that includes one or more manufacturing facilities for the fabrication of a variety of different IC products. In some embodiments, IC Fab 1030 is a semiconductor foundry. For example, there may be a manufacturing facility for the front end fabrication of a plurality of IC products (front-end-of-line (FEOL) fabrication), while a second manufacturing facility may provide the back end fabrication for the interconnection and packaging of the IC products (back-end-of-line (BEOL) fabrication), and a third manufacturing facility may provide other services for the foundry business.

IC fab 1030 uses mask(s) 1023 fabricated by mask house 1020 to fabricate IC device 1040. Thus, IC fab 1030 at least indirectly uses IC design layout diagram 1011 to fabricate IC device 1040. In some embodiments, semiconductor wafer 1033 is fabricated by IC fab 1030 using mask(s) 1023 to form IC device 1040. In some embodiments, the IC fabrication includes performing one or more lithographic exposures based at least indirectly on IC design layout diagram 1011. Semiconductor wafer 1033 includes a silicon substrate or other proper substrate having material layers formed thereon. Semiconductor wafer 1033 further includes one or more of various doped regions, dielectric features, multilevel interconnects, and the like (formed at subsequent manufacturing steps).

In some embodiments, a device is disclosed. The device includes multiple transistors, a sense circuit, and a precharge circuit. The transistors are coupled to a tracking bit line and configured to generate a first tracking signal. The sense circuit is configured to generate a first sense tracking signal in response to the first tracking signal. The precharge circuit is configured to generate, in response to a rising edge and a falling edge of the first sense tracking signal, a precharge signal for precharging data lines.

In some embodiments, gate terminals of the transistors are coupled together to a tracking word line and configured to receive a word line tracking signal.

In some embodiments, the transistors include a first transistor of a first conductivity type and at least one second transistor of a second conductivity type. A first terminal of the first transistor is configured to receive a reference voltage. A first terminal of the at least one second transistor is configured to receive a ground voltage. The first conductivity type and the second conductivity type are different from each other, and second terminals of the first transistor and the at least one second transistor are coupled together to the tracking bit line.

In some embodiments, gate terminals of first transistor and the at least one second transistor are coupled together to a tracking word line and configured to receive a word line tracking signal.

In some embodiments, in response to the word line tracking signal being at logic high, the at least one second transistor is configured to pull down a voltage of the first tracking signal.

In some embodiments, an amount of the transistors is substantially equal to an amount of cell rows in a memory array.

In some embodiments, the sense circuit includes a first transistor, a second transistor, and a third transistor. The first transistor, the second transistor, and the third transistor are coupled in series between a reference voltage and a ground voltage.

In some embodiments, the sense circuit further includes a fourth transistor. A first terminal of the fourth transistor, a first terminal of the first transistor, and a first terminal of the second transistor are coupled together, and a gate terminal of the fourth transistor, a second terminal of the second transistor, and a first terminal of the third transistor are coupled together to the precharge circuit.

In some embodiments, gate terminals of the first transistor, the second transistor, and the third transistor are coupled together to receive the first tracking signal.

In some embodiments, a device is also disclosed. The device includes a first sense circuit, a second sense circuit, and a control circuit. The first sense circuit is configured to generate a first sense tracking signal in response to a first tracking signal that is associated with multiple first tracking cells. The second sense circuit is configured to generate a second sense tracking signal in response to a second tracking signal that is associated with multiple second tracking cells. The control circuit is configured to generate, in response to the first sense tracking signal, a precharge signal for precharging data lines and generate, in response to the second sense tracking signal, a sense enable signal for enabling a sense amplifier circuit.

In some embodiments, the device further includes a first plurality of transistors and a second plurality of transistors. The first plurality of transistors are coupled to the first sense circuit and configured to generate the first tracking signal. The second plurality of transistors are coupled to the second sense circuit and configured to generate the second tracking signal.

In some embodiments, an amount of the second plurality of transistors is less than an amount of the first plurality of transistors.

In some embodiments, each of the first plurality of transistors and the second plurality of transistors includes a first transistor of a first conductivity type and at least one second transistor of a second conductivity type. A first terminal of the first transistor is configured to receive a reference voltage. A first terminal of the at least one second transistor is configured to receive a ground voltage. The first conductivity type and the second conductivity type are different from each other, and second terminals of the first transistor and the at least one second transistor are coupled together.

In some embodiments, gate terminals of first transistor and the at least one second transistor are coupled together to receive a word line tracking signal. In response to the word line tracking signal being at logic high, the at least one second transistor is configured to pull down a voltage of the first tracking signal and a voltage of the second tracking signal.

In some embodiments, each of the first sense circuit and the second sense circuit includes a first transistor of a first conductivity type, a second transistor of the first conductivity type, a third transistor of a second conductivity type, and a fourth transistor of the first conductivity type. The first transistor, the second transistor, and the third transistor are coupled in series between a reference voltage and a ground voltage.

In some embodiments, the control circuit is further configured to generate, in response to a read enable delayed signal, the precharge signal and generate, in response to the read enable delayed signal, the sense enable signal. The read enable delayed signal is associated with a read enable signal.

In some embodiments, a method is also disclosed. The method includes: generating a first tracking signal that is associated with a first plurality of transistors coupled to a first tracking bit line; in response to the first tracking signal being at logic low, generating a first sense tracking signal that is at logic high; and in response to a rising edge and a falling edge of the first sense tracking signal, generating a precharge signal for precharging data lines.

In some embodiments, generating the first tracking signal includes: generating a word line tracking signal that is associated with a clock signal; and in response to the word line tracking signal being at logic high, discharging a voltage of the first tracking signal by the first plurality of transistors.

In some embodiments, the method further includes: generating a read enable delayed signal that is associated with a read enable signal; and generating the precharge signal in response to a falling edge of the read enable delayed signal.

In some embodiments, the method further includes: generating a second tracking signal that is associated with a second plurality of transistors coupled to a second tracking bit line; in response to the second tracking signal being at logic low, generating a second sense tracking signal that is at logic high; and in response to the second sense tracking signal, generating a sense enable signal for enabling a sense amplifier circuit.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A device, comprising:
   a plurality of transistors coupled to a tracking bit line and configured to generate a first tracking signal;
   a sense circuit configured to generate a first sense tracking signal in response to the first tracking signal; and
   a precharge circuit configured to generate, in response to a falling edge of the first sense tracking signal, a precharge signal having a falling edge, wherein the precharge signal is for precharging data lines.

2. The device of claim 1, wherein gate terminals of the plurality of transistors are coupled together to a tracking word line and configured to receive a word line tracking signal.

3. The device of claim 1, wherein the plurality of transistors include:
   a first transistor of a first conductivity type, a first terminal of the first transistor being configured to receive a reference voltage; and at least one second transistor of a second conductivity type, a first terminal of the at least one second transistor being configured to receive a ground voltage;

wherein the first conductivity type and the second conductivity type are different from each other, and second terminals of the first transistor and the at least one second transistor are coupled together to the tracking bit line.

4. The device of claim 3, wherein gate terminals of first transistor and the at least one second transistor are coupled together to a tracking word line and configured to receive a word line tracking signal.

5. The device of claim 4, wherein the at least one second transistor is configured to pull down, in response to the word line tracking signal being at logic high, a voltage of the first tracking signal.

6. The device of claim 1, wherein an amount of the plurality of transistors is substantially equal to an amount of cell rows in a memory array.

7. The device of claim 1, wherein the sense circuit comprises:
a first transistor;
a second transistor; and
a third transistor;
wherein the first transistor, the second transistor, and the third transistor are coupled in series between a reference voltage and a ground voltage.

8. The device of claim 7, wherein the sense circuit further comprises:
a fourth transistor,
wherein a first terminal of the fourth transistor, a first terminal of the first transistor, and a first terminal of the second transistor are coupled together, and a gate terminal of the fourth transistor, a second terminal of the second transistor, and a first terminal of the third transistor are coupled together to the precharge circuit.

9. The device of claim 7, wherein gate terminals of the first transistor, the second transistor, and the third transistor are coupled together to receive the first tracking signal.

10. A device, comprising:
a first sense circuit configured to generate a first sense tracking signal in response to a first tracking signal that is associated with a plurality of first tracking cells;
a second sense circuit configured to generate a second sense tracking signal in response to a second tracking signal that is associated with a plurality of second tracking cells; and
a control circuit configured to:
generate, in response to the first sense tracking signal, a precharge signal for precharging data lines; and
generate, in response to the second sense tracking signal, a sense enable signal for enabling a sense amplifier circuit.

11. The device of claim 10, further comprising:
a first plurality of transistors coupled to the first sense circuit and configured to generate the first tracking signal; and
a second plurality of transistors coupled to the second sense circuit and configured to generate the second tracking signal.

12. The device of claim 11, wherein an amount of the second plurality of transistors is less than an amount of the first plurality of transistors.

13. The device of claim 11, wherein each of the first plurality of transistors and the second plurality of transistors includes:

a first transistor of a first conductivity type, a first terminal of the first transistor being configured to receive a reference voltage; and at least one second transistor of a second conductivity type, a first terminal of the at least one second transistor being configured to receive a ground voltage;

wherein the first conductivity type and the second conductivity type are different from each other, and second terminals of the first transistor and the at least one second transistor are coupled together.

14. The device of claim 13, wherein
gate terminals of first transistor and the at least one second transistor are coupled together to receive a word line tracking signal; and
in response to the word line tracking signal being at logic high, the at least one second transistor is configured to pull down a voltage of the first tracking signal and a voltage of the second tracking signal.

15. The device of claim 10, wherein each of the first sense circuit and the second sense circuit comprises:
a first transistor of a first conductivity type;
a second transistor of the first conductivity type;
a third transistor of a second conductivity type; and
a fourth transistor of the first conductivity type;
wherein the first transistor, the second transistor, and the third transistor are coupled in series between a reference voltage and a ground voltage.

16. The device of claim 10, wherein the control circuit is further configured to:
pulling low, in response to a falling edge of a read enable delayed signal, the precharge signal; and
generate, in response to the read enable delayed signal, the sense enable signal;
wherein the read enable delayed signal is associated with a read enable signal.

17. A method, comprising:
generating a first tracking signal that is associated with a first plurality of transistors coupled to a first tracking bit line;
in response to the first tracking signal being at logic low, generating a first sense tracking signal that is at logic high; and
in response to a falling edge of the first sense tracking signal, generating a precharge signal having a falling edge, wherein the precharge signal is for precharging data lines.

18. The method of claim 17, wherein generating the first tracking signal comprises:
generating a word line tracking signal that is associated with a clock signal; and
in response to the word line tracking signal being at logic high, discharging a voltage of the first tracking signal by the first plurality of transistors.

19. The method of claim 17, further comprising:
generating a read enable delayed signal that is associated with a read enable signal; and
pulling low the precharge signal in response to a falling edge of the read enable delayed signal.

20. The method of claim 19, further comprising:
generating a second tracking signal that is associated with a second plurality of transistors coupled to a second tracking bit line;

in response to the second tracking signal being at logic low, generating a second sense tracking signal that is at logic high; and in response to the second sense tracking signal, generating a sense enable signal for enabling a sense amplifier circuit.

\* \* \* \* \*